United States Patent
Lian

(10) Patent No.: US 11,417,140 B2
(45) Date of Patent: Aug. 16, 2022

(54) DISPLAY PANEL AND DISPLAY DEVICE

(71) Applicant: Hubei Yangtze Industrial Innovation Center Of Advanced Display Co., Ltd., Wuhan (CN)

(72) Inventor: Lu Lian, Shanghai (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 7 days.

(21) Appl. No.: 17/170,518

(22) Filed: Feb. 8, 2021

(65) Prior Publication Data
US 2021/0158004 A1 May 27, 2021

(30) Foreign Application Priority Data
Dec. 29, 2020 (CN) .......................... 202011595722.8

(51) Int. Cl.
*G06V 40/10* (2022.01)
*G06V 40/13* (2022.01)
*H01L 27/32* (2006.01)
*H01L 51/52* (2006.01)

(52) U.S. Cl.
CPC ...... *G06V 40/1306* (2022.01); *G06V 40/1318* (2022.01); *H01L 27/323* (2013.01); *H01L 27/3246* (2013.01); *H01L 51/5209* (2013.01); *H01L 51/5225* (2013.01); *H01L 51/5253* (2013.01)

(58) Field of Classification Search
CPC ............ G06V 40/1306; G06V 40/1318; H01L 27/323; H01L 27/3246; H01L 51/5209; H01L 51/5225; H01L 51/5253
See application file for complete search history.

(56) References Cited

U.S. PATENT DOCUMENTS

2019/0251378 A1* 8/2019 Jung .................. G06V 40/1306

FOREIGN PATENT DOCUMENTS

| CN | 106935601 A | 7/2017 |
|---|---|---|
| CN | 109309109 A | 2/2019 |
| CN | 110265457 A | 9/2019 |
| CN | 110765968 A | 2/2020 |

* cited by examiner

*Primary Examiner* — Abdul-Samad A Adediran
(74) *Attorney, Agent, or Firm* — Christensen O'Connor Johnson Kindness PLLC

(57) ABSTRACT

A display panel and a display device are provided. The display panel includes a display area, at least a part of which is reused as a fingerprint recognition area, and a plurality of fingerprint recognition pixels located in the fingerprint recognition area. The display area includes light-emitting sub-pixels, a substrate, a driving circuit layer, and a pixel definition layer having openings for defining light exiting areas of the light-emitting sub-pixel. The fingerprint recognition pixel includes an ultrasonic fingerprint sensor and a reading control circuit located in the driving circuit layer, and the ultrasonic fingerprint sensor includes a first electrode, an ultrasonic material layer, and a second electrode, which are arranged sequentially from the substrate to the driving circuit layer. The first electrode is electrically connected to the reading control circuit, and the ultrasonic material layer is on a side of the pixel definition layer facing away from the substrate.

20 Claims, 17 Drawing Sheets

DISPLAY PANEL AND DISPLAY DEVICE

CROSS-REFERENCE TO RELATED APPLICATION

The present application claims priority to Chinese Patent Application No. 202011595722.8, filed on Dec. 29, 2020, the content of which is incorporated herein by reference in its entirety.

TECHNICAL FIELD

The present application relates to the field of display technology, and particularly, to a display panel and a display device.

BACKGROUND

With the rapid development of display technology, display devices with biometric recognition function have gradually been introduced into people's lives and work. Fingerprint recognition technology has been widely used in unlocking, secure payment, and other applications in view of the unique characteristics of an individual's fingerprint. Ultrasonic fingerprint recognition technology is an emerging fingerprint recognition technology that can accurately identify fingerprints even when there is water or stain on the surface of the finger, and, thus, has attracted much attention.

SUMMARY

In one aspect, the present disclosure provides a display panel. The display panel includes a substrate, a driving circuit layer located on the substrate, and a light-emitting element layer located on a side of the driving circuit layer facing away from the substrate. The display panel includes a plurality of light-emitting sub-pixels arranged in a display area of the display panel, and a plurality of fingerprint recognition pixels arranged in a fingerprint recognition area, and at least a part of the display area is reused as the fingerprint recognition area. Each of the plurality of light-emitting sub-pixels includes a light-emitting element and a pixel driving circuit electrically connected to the light-emitting element, the pixel driving circuit is arranged in the driving circuit layer, the light-emitting element is in the light-emitting element layer, the light-emitting element layer includes a pixel definition layer, and the pixel definition layer has openings, each of which is used to define a light exiting area of one of the plurality of light-emitting sub-pixels. Each of the plurality of fingerprint recognition pixels includes an ultrasonic fingerprint sensor and a reading control circuit. The reading control circuit is arranged in the driving circuit layer. The ultrasonic fingerprint sensor includes a first electrode, an ultrasonic material layer and a second electrode that are arranged sequentially along a direction from the substrate to the driving circuit layer. The first electrode is electrically connected to the reading control circuit, and the ultrasonic material layer is located on a side of the pixel definition layer facing away from the substrate.

In another aspect, the present disclosure provides a display device including the above display panel.

BRIEF DESCRIPTION OF DRAWINGS

In order to more clearly explain technical solutions of embodiments of the present disclosure, the drawings of the embodiments are briefly described as below. The drawings described below are merely some of the embodiments of the present disclosure. On basis of these drawings, those skilled in the art can obtain other drawings.

DESCRIPTION OF EMBODIMENTS

For better understanding of the technical solution of the present disclosure, the embodiments of the present disclosure are described in detail as below.

It will be understood that the embodiments described below are merely some of, rather than all of the embodiments of the present disclosure. Based on the embodiments described in the present disclosure, all other embodiments can be obtained by those skilled in the art.

The terms used in the embodiments of the present disclosure are merely for the purpose of describing specific embodiments, but not intended to limit the present disclosure. The singular forms of "a", "an" and "the" used in the embodiments of the present disclosure and the appended claims are also intended to indicate plural forms, unless clearly indicating others.

It will be understood that the term "and/or" used herein merely indicates a relationship describing associated objects, indicating three possible relationships. For example, A and/or B can indicate: A alone, A and B, or B alone. In addition, the character "/" in this description generally means that the associated objects are in an "or" relationship.

Figure 1:
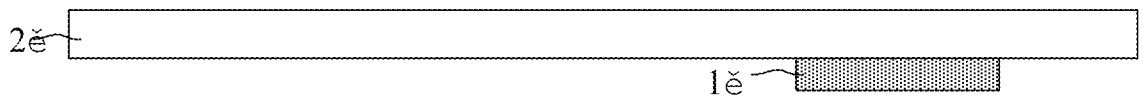
FIG. 1 is a schematic diagram showing an ultrasonic fingerprint recognition sensor mounting to a display panel in related art.

FIG. 1 shows an ultrasonic fingerprint recognition sensor mounted to a display panel in the related art. As shown in FIG. 1, the ultrasonic fingerprint recognition sensor 1' is typically adhered to a backlight side of the display panel 2' in an added-on manner. However, such configuration will increase the overall thickness of the assembly. Further, when the fingerprint recognition sensor is added to a non-full-screen, it needs to consider the backlight side flatness of the assembly, increasing the attachment difficult. Furthermore, when the fingerprint recognition sensor is applied in a flexible display device, bending flexible display device can cause the ultrasonic fingerprint recognition sensor 1' to be misaligned with the display panel 2' or even separated from the display panel 2', thereby causing a bad influence on fingerprint recognition.

Figure 2:
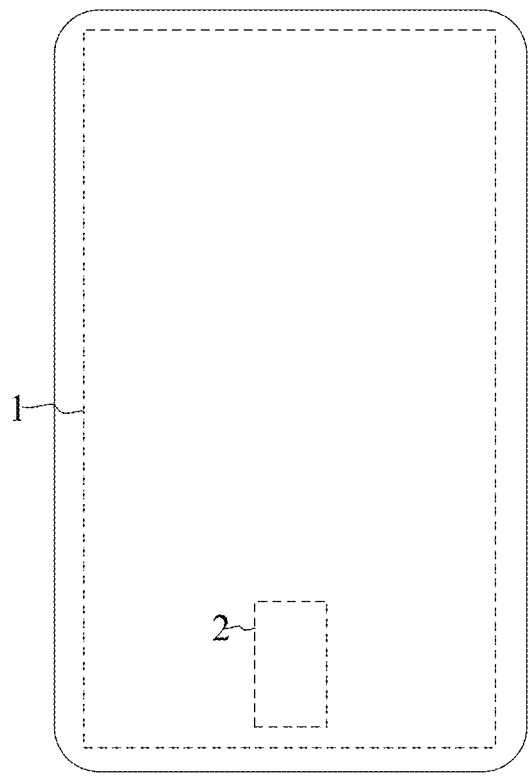
FIG. 2 is a top view of a display panel according to an embodiment of the present disclosure.
Figure 3:
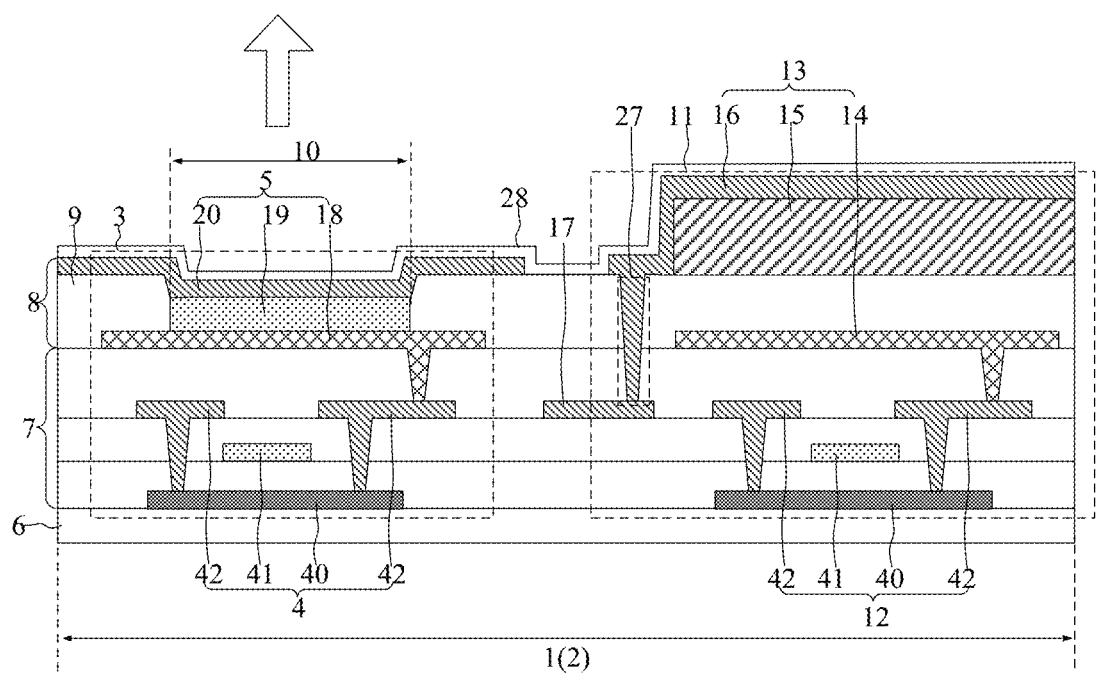
FIG. 3 shows a schematic diagram of layers of a fingerprint recognition pixel according to an embodiment of the present disclosure.

An embodiment of the present disclosure provides a display panel. FIG. 2 is a top view of a display panel according to an embodiment of the present disclosure. FIG. 3 is a schematic diagram of layers of a fingerprint recognition pixel according to an embodiment of the present disclosure. As shown in FIG. 2 and FIG. 3, the display panel has a display area 1. At least a part of the display area 1 is reused as a fingerprint recognition area 2. The display area 1 includes a plurality of light-emitting sub-pixels 3, and each of the plurality of light-emitting sub-pixels 3 includes a pixel driving circuit 4 and a light-emitting element 5 that are electrically connected to each other. The display panel includes a substrate 6, a driving circuit layer 7 located on the substrate 6, and a light-emitting element layer 8 located on a side of the driving circuit layer 7 facing away from the substrate 6. The pixel driving circuit 4 is located in the driving circuit layer 7. The light-emitting element 5 is disposed in the light-emitting element layer 8. The light-emitting element layer 8 includes a pixel definition layer 9, and the pixel definition layer 9 has openings 10 and the opening 10 defines a light exiting area of the light-emitting sub-pixel 3.

The display panel further includes a plurality of fingerprint recognition pixels 11 located in the fingerprint recognition area 2. Each of the plurality of fingerprint recognition pixels 11 includes a reading control circuit 11 and an ultrasonic fingerprint sensor 13. The reading control circuit 12 is disposed in the driving circuit layer 7. The ultrasonic fingerprint sensor 13 includes a first electrode 14, an ultrasonic material layer 15, and a second electrode 16 that are arranged sequentially along a direction from the substrate 6 to the driving circuit layer 7. The first electrode 14 is electrically connected to the reading control circuit 12, and the ultrasonic material layer 15 is located on a side of the pixel definition layer 9 facing away from the substrate 6.

Figure 4:
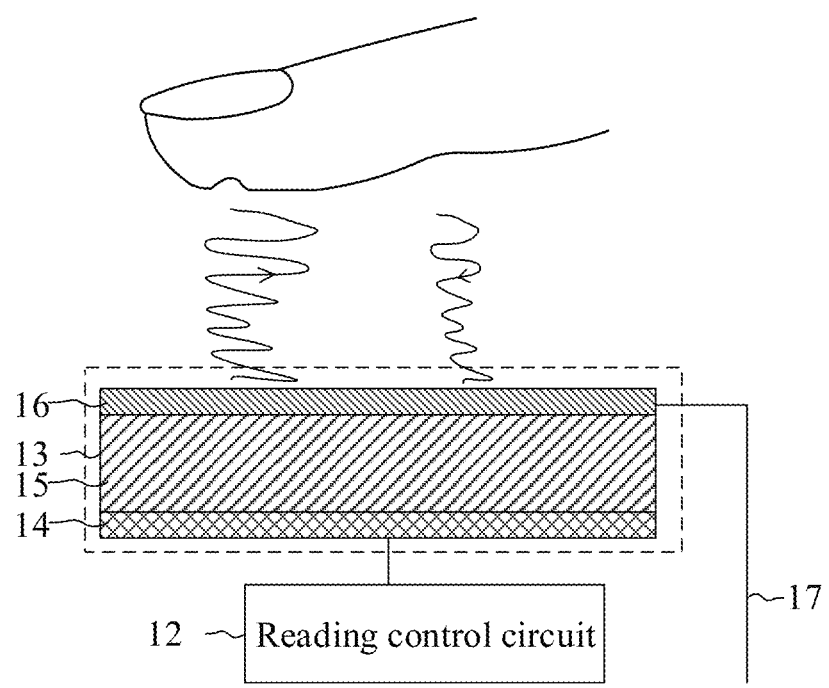
FIG. 4 is a schematic diagram showing connections of an ultrasonic fingerprint recognition sensor according to an embodiment of the present disclosure.
Figure 5:
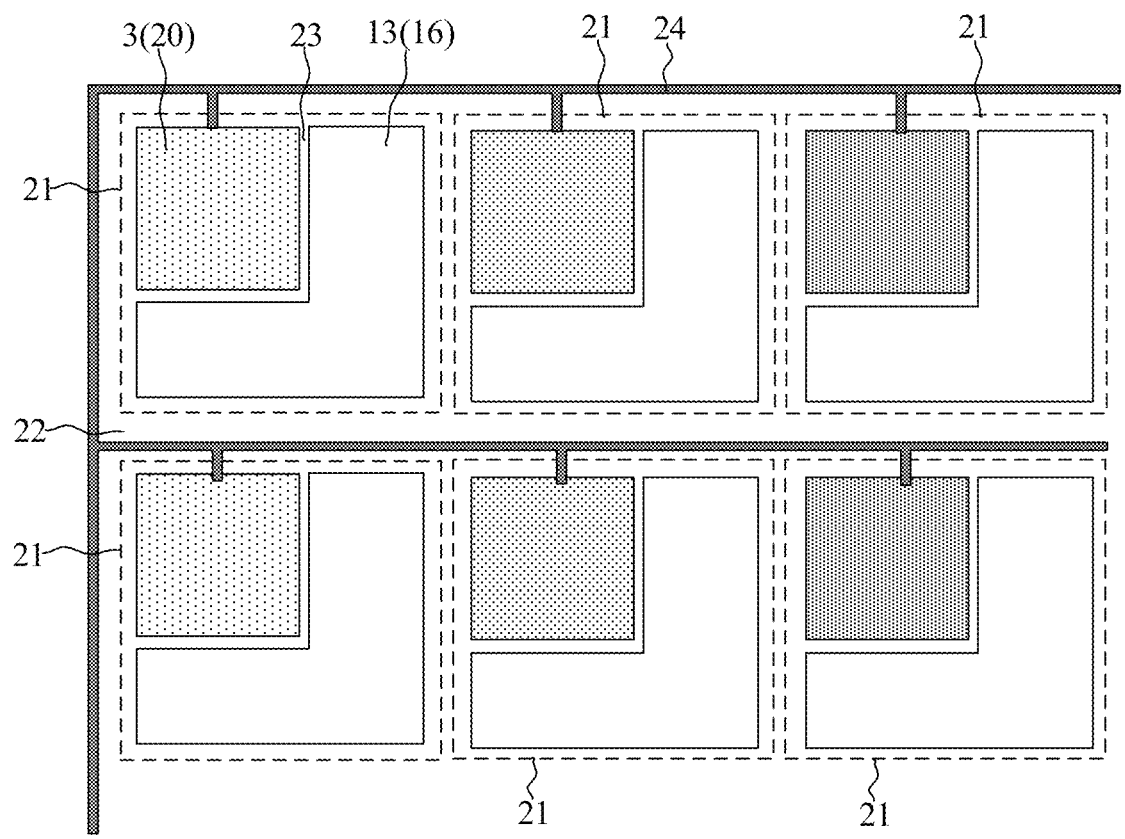
FIG. 5 is a schematic diagram showing an arrangement of a first electrode or a second electrode in the ultrasonic fingerprint recognition sensor according to an embodiment of the present disclosure.
Figure 6:
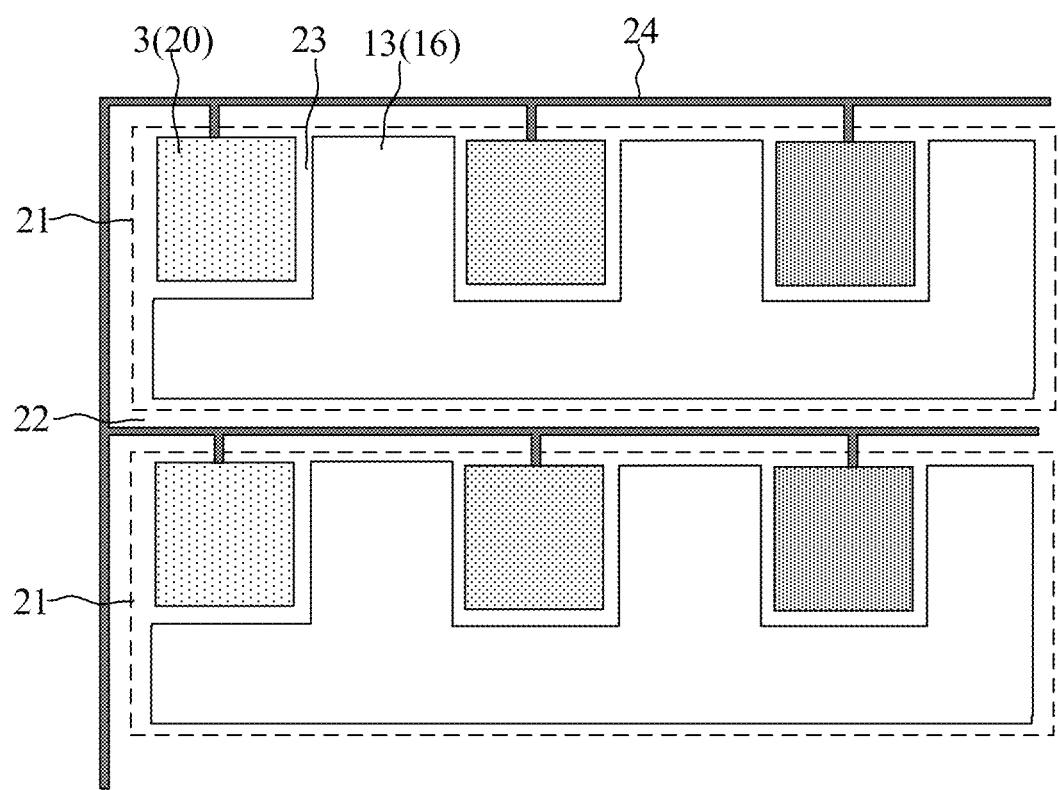
FIG. 6 is a schematic diagram showing an arrangement of a first electrode or a second electrode in the ultrasonic fingerprint recognition sensor according to an embodiment of the present disclosure.

FIG. 4 is a schematic diagram showing connections of an ultrasonic fingerprint recognition sensor according to an embodiment of the present disclosure. As shown in FIG. 4, the first electrode 14 of the ultrasonic fingerprint sensor 13 is electrically connected to the reading control circuit 12, and the second electrode 16 is electrically connected to a detection signal line 17. When the ultrasonic fingerprint sensor 13 operates, the detection signal line 17 outputs a first electrical detection signal for recognition to the second electrode 16, the ultrasonic material layer 15 converts the first electrical detection signal into a first ultrasonic detection signal and sends the first ultrasonic detection signal to a finger, and then a second ultrasonic recognition signal reflected by the finger is converted into a second electrical recognition signal by the ultrasonic material layer 15 and is transmitted to the reading control circuit 12, the second electrical recognition signal is transmitted to a processor via the reading control circuit 12, and the processor recognizes a valley and a ridge of the fingerprint according to the obtained second electrical recognition signal.

It will be noted that reusing at least a part of the display area 1 as the fingerprint recognition area 2 indicates that the fingerprint recognition area 2 is located in the display area 1, and at least a part of the display area 1 is not only used for displaying image but also used for recognizing fingerprint. Exemplarily, if a part of the display area 1 is reused as the fingerprint recognition area 2, please refer to FIG. 2 again, only this part of the display area 1 is used for fingerprint recognition; while if the entirety of the display area 1 is reused as the fingerprint recognition area 2, the entirety of the display area 1 can be used for fingerprint recognition.

Referring again to FIG. 3, it is noted that the driving circuit layer 7 includes an active layer 40, a gate 41 and a source/drain 42 that are stacked. The pixel driving circuit 4 and the reading control circuit 12 each includes a transistor formed by the active layer 40, the gate 41, and the source/drain 42. The pixel driving circuit 4 is configured to transmit, based on cooperation of multiple transistors, a driving current to the light-emitting element 5 to drive the light-emitting element 5 to emit light. The reading control circuit 12 is configured to transmit, based on cooperation of multiple transistors, the electrical recognition signal detected by the ultrasonic fingerprint sensor 13 to the processor.

Compared with the fingerprint recognition structure adhered to the backlight side of the display panel, all of layers of the reading control circuit 12 and the ultrasonic fingerprint recognition sensor 13 that are configured to recognize fingerprint are integrated inside the display panel in embodiments of the present disclosure. On one hand, the fingerprint recognition structure does not need to be externally mounted to the outside of the display panel, which not only reduces the thickness, but also facilitates the light and thin design, and also avoids the non-flatness of the backlight side of the display panel. On another hand, when the display panel is a flexible display panel, even if the display panel is bent, the fingerprint recognition structure will not be separated from the display panel, thereby improving the reliability of the fingerprint recognition structure. On yet another hand, by integrating the fingerprint recognition structure inside the display panel, the distance between the ultrasonic fingerprint recognition sensor 13 and the finger is reduced, the transmission attenuation of the ultrasonic signal is reduced in both the process the ultrasonic fingerprint recognition sensor 13 transmits the ultrasonic detection signal to the finger and the process the ultrasonic fingerprint recognition sensor 13 receives the ultrasonic recognition signal reflected by the finger, thereby increasing the signal intensity and further increasing the recognition precision.

In an embodiment, for the top-emission light-emitting element, please refer to FIG. 3 again, the light emitted by the light-emitting element 5 exits in the direction from the substrate 6 to the driving circuit layer 7 (the light-exiting direction is shown by the arrow in the figure). At the same time, the finger touches the side, the ultrasonic fingerprint recognition 13 facing away from the reading control circuit 12, of the display panel, and the ultrasonic material layer 15 is provided on the pixel definition layer 9 facing away from the substrate 6. In this way, the distance between the ultrasonic material layer 15 and the finger is reduced, the transmission loss of the ultrasonic detection signal and the transmission loss of the ultrasonic recognition signal is also reduced, and the recognition precision is further improved.

In an implementation, referring again to FIG. 3, the light-emitting element layer 8 further includes: an anode 18 located on a side of the pixel definition layer 9 facing towards the substrate 6, a light-emitting layer 19 located in the opening 10, and a cathode 20. At least a part of the anode 18 is exposed in the opening 20, and a first part of the cathode 20 is located on a side of the pixel definition layer 9 facing away from the substrate 6 and another part of the cathode 20 is located on a side of the light-emitting layer 19 facing away from the substrate 6. The first electrode 14 or the second electrode 16 of the ultrasonic fingerprint recognition 13 is arranged in a same layer and made of a same material as the cathode 20, thereby saving the process for forming the first electrode 14 or the second electrode 16 and avoiding that the first electrode 14 or the second electrode 16 occupies an additional layer.

Since the cathodes 20 of light-emitting elements 5 receive a same cathode signal, the cathode 20 in the light-emitting element layer 8 is typically an entire layer in the related art. When the first electrode 14 or the second electrode 16 of the ultrasonic fingerprint recognition 13 is arranged in a same layer with the cathode 20, a signal received by an electrode of the ultrasonic fingerprint recognition 13 is different from the cathode signal required by the light-emitting element 5, so it needs to adjust the layers of the cathode 20 such that the cathode 20 of the light-emitting element 5 and the first electrode 14 or the second electrode 16 of the ultrasonic fingerprint sensor 13 are staggered with each other and are electrically insulated from each other.

In embodiments of the present disclosure, as shown in FIG. 5 to FIG. 8, the first electrode 14 or the second electrode 16 is arranged in the same layer with the cathode 20. FIG. 5 to FIG. 8 illustrate the arrangement of the first electrode 14 or the second electrode 16 of the ultrasonic fingerprint sensor 13. FIG. 5, FIG. 6, FIG. 7 and FIG. 8 are exemplary illustrations where the second electrode 16 is arranged in the same layer with the cathode 20. The fingerprint recognition area 2 includes a plurality of sub-areas 21 which have a same size, and adjacent sub-areas 21 are spaced apart by a first spacing 22. Each of the plurality of sub-areas 21 includes at least one light-emitting sub-pixel 3 and one ultrasonic fingerprint sensor 13. The cathode 20 of the light-emitting sub-pixel 3 is spaced apart from the first electrode 14 or the second electrode 16 of the ultrasonic fingerprint sensor 13 by a second spacing 23. In this way, the cathode 20 and the first electrode 14/the second electrode 16 are electrically insulated from each other, and the cathodes 20 of multiple light-emitting sub-pixels 3 are electrically connected together by a connection electrode 24 which extends in the first spacing 22, such that the cathodes 20 of all the light-emitting sub-pixels 3 in the fingerprint recognition area 2 are electrically connected, ensuring that all the cathodes 20 are electrically connected to each other and can receive the cathode signal.

Based on the above area division, with ensuring the electrical insulation between the cathodes 20 and the electrode of the ultrasonic fingerprint sensor 13, one ultrasonic fingerprint sensor 13 is arranged in each sub-area 21, such that the ultrasonic fingerprint sensors 13 are uniformly distributed in the entire fingerprint recognition area 2, and thus the fingerprint can be recognized more accurately.

Figure 7:
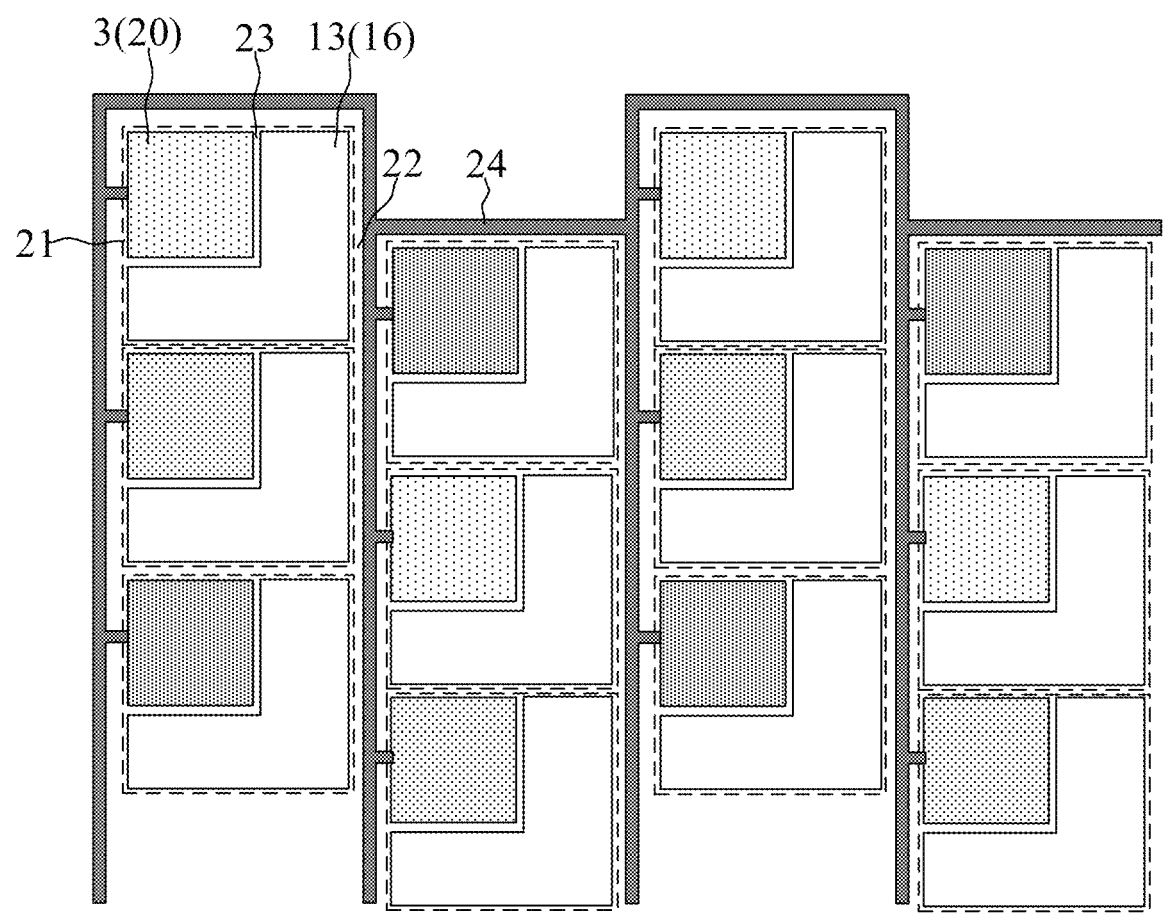
FIG. 7 is a schematic diagram showing an arrangement of a first electrode or a second electrode in the ultrasonic fingerprint recognition sensor according to an embodiment of the present disclosure.
Figure 9:
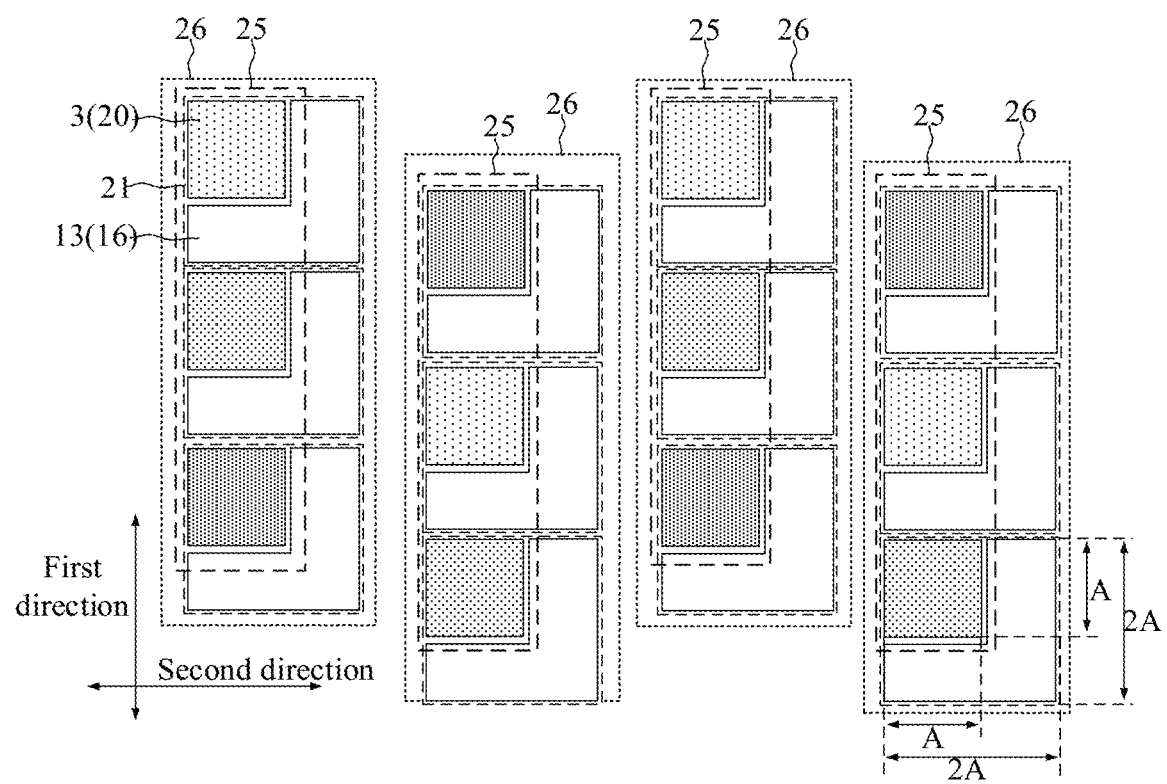
FIG. 9 is a schematic diagram showing a size of a sub-area shown in FIG. 7 according to an embodiment of the present disclosure.

FIG. 9 is a schematic diagram showing dimensions of the sub-area 21 shown in FIG. 7. In an embodiment, in conjunction with FIG. 7, as shown in FIG. 9, the plurality of light-emitting sub-pixels 3 forms a plurality of sub-pixel groups 25 arranged in a first direction, and each of the plurality of sub-pixel groups 25 includes multiple light-emitting sub-pixels 3 arranged in a second direction. The light-emitting sub-pixels 3 in two adjacent sub-pixel groups 25 are arranged in a staggered along the first direction, and the first direction intersects with the second direction. The fingerprint recognition area 2 includes a plurality of sub-area groups 26 arranged in the first direction, and each of the plurality of sub-area groups 26 includes multiple sub-areas 21 arranged in the second direction. In the first direction, the multiple sub-areas 21 in two adjacent sub-area group 26 are arranged in a staggered manner in the first direction.

In an embodiment, one light-emitting sub-pixel 3 and one ultrasonic fingerprint sensor 13 are arranged in each sub-area 21, the cathode 20 of the light-emitting sub-pixel 3 is located at a vertex angle of the sub-area 21 and has a length of A in each one of the first direction and the second direction, and the sub-area 21 has a length of 2A in each one of the first direction and the second direction. Exemplarily, when the length of the cathode 20 of the light-emitting sub-pixel 3 in each one of the first direction and the length in the second direction is 20 μm, the sub-area 21 where the light-emitting sub-pixel 3 is located is a 40 μm*40 μm square. In this case, excluding the width of the second spacing 23, the maximum lengths of the first electrode 14 or the second electrode 16 in each one of the first direction and the second direction is close to 40 μm.

One light-emitting sub-pixel 3 and one ultrasonic fingerprint sensor 13 are located in the sub-area 21, ensuring the uniform distribution of the ultrasonic fingerprint sensors 13 in the fingerprint recognition area 2, increasing the number of the ultrasonic fingerprint sensors 13 disposed in the fingerprint recognition area 2, and improving the recognition accuracy.

Figure 8:
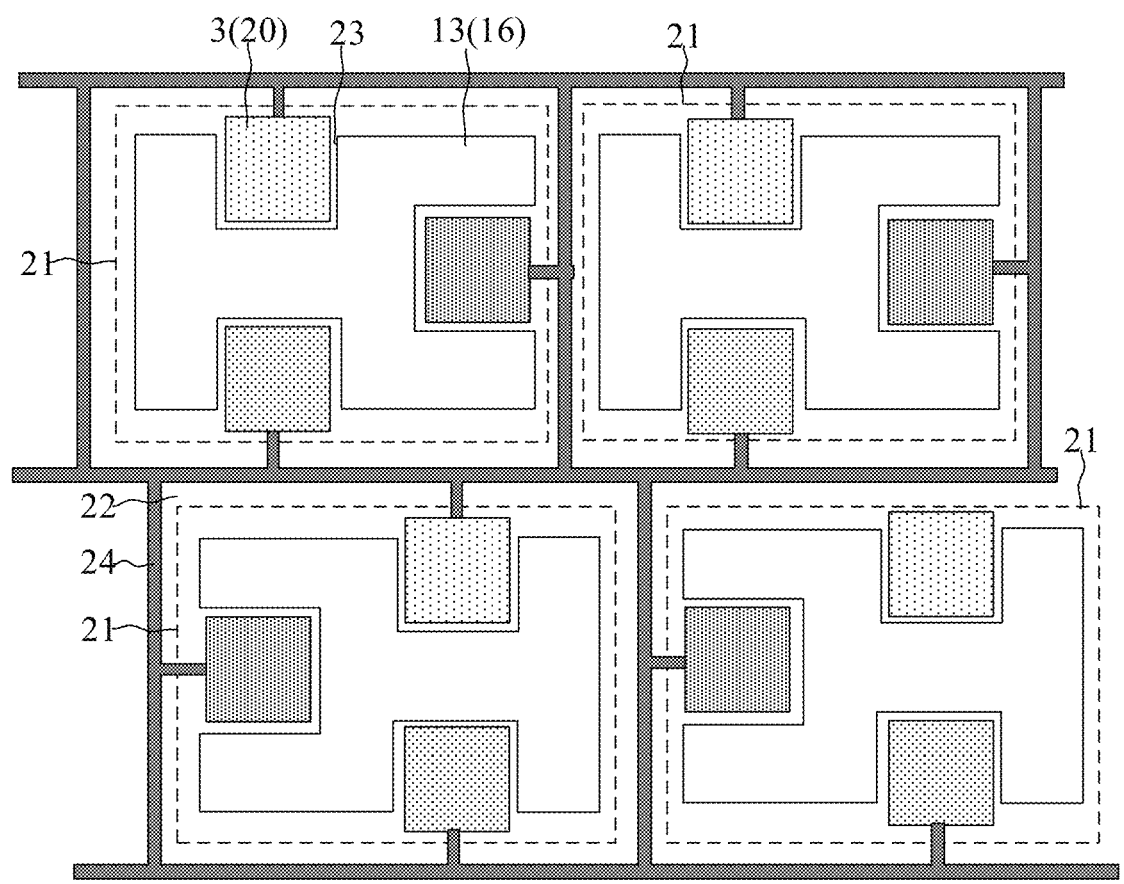
FIG. 8 is a schematic diagram showing an arrangement of a first electrode or a second electrode in the ultrasonic fingerprint recognition sensor according to an embodiment of the present disclosure.
Figure 10:
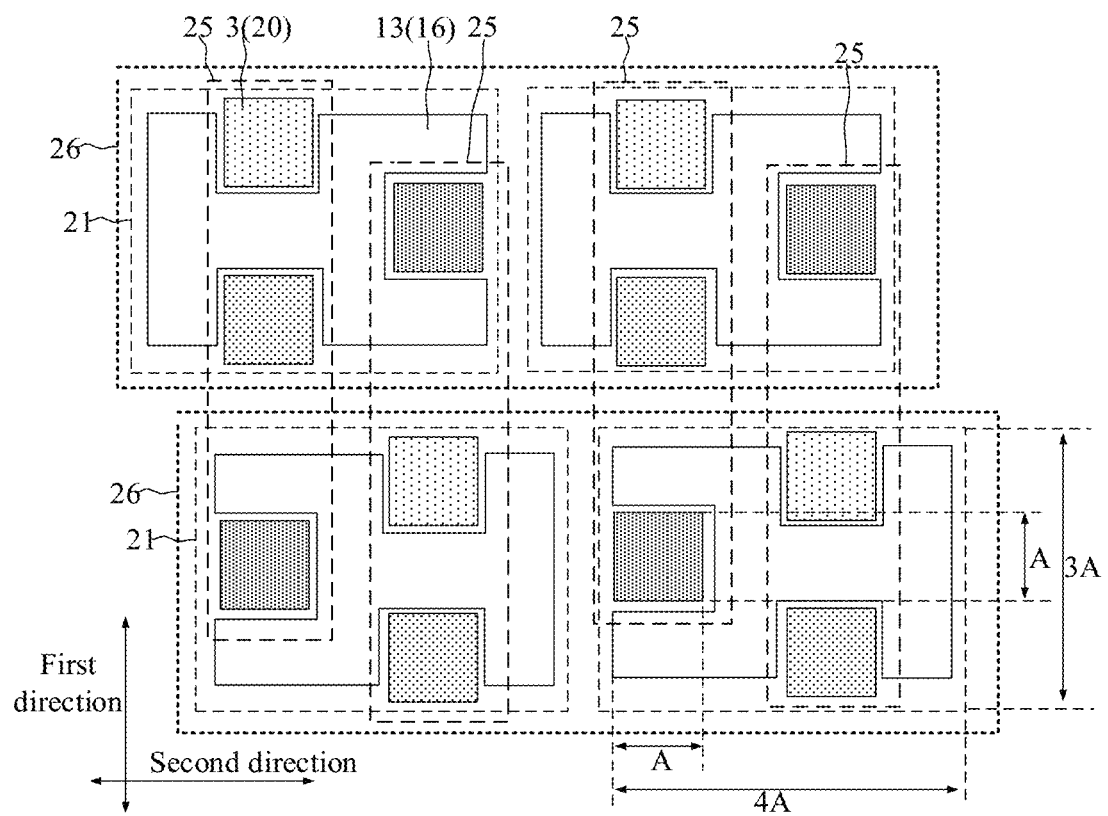
FIG. 10 is a schematic diagram showing a size of a sub-area shown in FIG. 8 according to an embodiment of the present disclosure.

FIG. 10 is a schematic diagram showing dimensions of the sub-area 21 shown in FIG. 8. In an embodiment, in conjunction with FIG. 8, as shown in FIG. 10, the plurality of light-emitting sub-pixels 3 form a plurality of sub-pixel groups 25 arranged in the first direction, and multiple light-emitting sub-pixels 3 arranged in the second direction are provided in each of the plurality of sub-pixel groups 25. The multiple light-emitting sub-pixels 3 in adjacent sub-pixel groups 25 are arranged in a staggered manner along the first direction, and the first direction intersects with the second direction. The fingerprint recognition area 2 includes a plurality of sub-area groups 26 arranged in the second direction, and each of the plurality of sub-area groups 26 includes multiple sub-areas 21 arranged in the first direction. The multiple sub-areas 21 in two adjacent sub-area groups 26 are arranged in a staggered manner along the second direction.

In an embodiment, three light-emitting sub-pixels 3 having three different colors from each other, and one ultrasonic fingerprint sensor 13 are arranged in each sub-area 21, the cathode 20 of the light-emitting sub-pixel 3 has a length of A in each one of the first direction and the second direction, the sub-area 21 has a length of 4A in the first direction and a length of 3A in the second direction. Exemplarily, when the cathode 20 of the light-emitting sub-pixel 3 has a length of 20 µm in each one of the first direction and the second direction, the sub-area 21 where the light-emitting sub-pixel 3 is located is a 60 µm*80 µm rectangle. In this case, excluding the width of the second spacing 23, the maximum length of the first electrode 14 or the second electrode 16 in the first direction is close to 80 µm, and the maximum length of the first electrode 14 or the second electrode 16 in the second direction is close to 60 µm. Such lengths satisfy the reading accuracy of finger fingerprints to a greater extent.

Based on the above configuration, the electrode of the ultrasonic fingerprint sensor 13 has a larger coverage area, and accordingly, the reading control circuit 12 corresponding to the ultrasonic fingerprint sensor 13 has a larger arranging space, which better meets requirement of the structure design that the reading control circuit 12 includes multiple transistors.

In an implementation, referring again to FIG. 3, the second electrode 16 and the cathode 20 are arranged in the same layer, and a projection of the ultrasonic material layer 15 on the substrate 6 and a projection of the cathode 20 on the substrate 6 do not overlap with each other. In this case, the ultrasonic material layer 15 is located between the second electrode 16 and the pixel definition layer 9, and the ultrasonic material layer 15 does not cover the opening 10.

For the top-emission light-emitting element, the light emitted by the light-emitting sub-pixel 3 is transmitted in the direction from the substrate 6 to the driving circuit layer 7. When the ultrasonic material layer 15 is above the pixel definition layer 9 and does not overlap with the opening 10, the light exiting through the opening does not pass through the ultrasonic material layer 15 in the transmission process thereof, which not only prevents the light from affecting the material property of the ultrasonic material layer 15 but also prevents the light from attenuating when passing through the ultrasonic material layer 15, thereby increasing the light intensity and optimizing the display effect.

Figure 11:
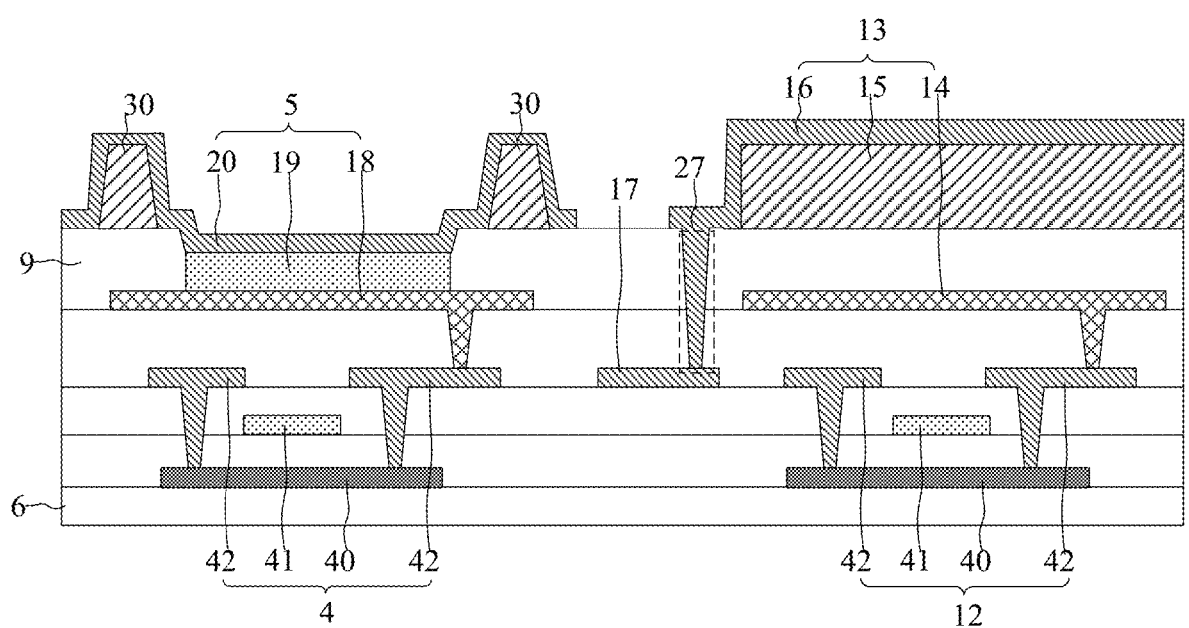
FIG. 11 is a schematic diagram of layers of a fingerprint recognition pixel according to an embodiment of the present disclosure.

FIG. 11 is a schematic diagram of layers of the fingerprint recognition pixel 11 according to an embodiment of the present disclosure. As shown in FIG. 11, the display panel further includes spacers 30. The spacer 30 is located between the cathode 20 and the pixel definition layer 9. In embodiments of the present disclosure, in order to simplify the process flow, the spacer 30 and the ultrasonic material layer 15 are arranged in a same layer and made of a same material, that is, the spacer 30 is also made of the ultrasonic material.

In an embodiment, referring again to FIG. 3, when the second electrode 16 and the cathode 20 are arranged in the same layer, in order to simplify the process flow of the first electrode 14 and prevent the first electrode 14 from occupying an additional layer, the first electrode 14 and the anode 18 can be arranged in the same layer and made of the same material.

It should be noted that when the first electrode 14 and the anode 18 are arranged in the same layer, both the pixel definition layer 9 and the ultrasonic material layer 15 are located between the first electrode 14 and the second electrode 16, and the ultrasonic signal can pass through the pixel definition layer 9 and the ultrasonic material layer 15 during the transmission process. In an embodiment, in order to avoid a large acoustic impedance difference between the pixel definition layer 9 and the ultrasonic material layer 15 and avoid an excessive weakening of the ultrasonic signal during the transmission between the first electrode 14 and the second electrode 15, a ratio of the absolute value of the acoustic impedance difference between the pixel definition layer 9 and the ultrasonic material layer 15 to the acoustic impedance of the ultrasonic material layer 15 is smaller than or equal to 10%. For example, the acoustic impedance of the ultrasonic material layer 15 and the acoustic impedance of the pixel definition layer 9 can be equal. Herein, the acoustic impedance refers to the complex number ratio of the sound pressure of a medium on a certain area of the wavefront to the volume velocity through this area.

In an embodiment, referring again to FIG. 3, the second electrode 16 is electrically connected to the detection signal line 17 though a first via hole of the pixel definition layer 9. A projection of the first via hole 27 on the substrate 6 is located between a projection of the light-emitting layer 19 on the substrate and the projection of the ultrasonic material layer 15 on the substrate 6, such that the material in the first via hole 27 formed in the deposition process of the second electrode 16 can block the light emitted obliquely from the light-emitting sub-pixel 3, which not only improves the color-cast, but also prevents the leaked light in the oblique direction from being incident to the ultrasonic material layer 15.

In an embodiment, referring again to FIG. 3, the display panel further includes a protection layer 28 provided on a side of the second electrode 16 facing away from the substrate 6. The protection layer 28 can prevent water and oxygen from penetrating into the layers inside the display panel.

The light-emitting element 5 can be a top-emission light-emitting element or a bottom-emission light-emitting element. When the light-emitting element 5 is a top-emission light-emitting element, the light emitted by the light-emitting element 5 is transmitted in a direction from the substrate 6 to the driving circuit layer 7. In this case, the anode 18 of the light-emitting element 5 is a reflective electrode made of an opaque metal material and is used for reflecting back the light emitted in other directions, and the cathode 20 is a transparent electrode made of a transparent conductive material and is used for reducing the block to the emitted light. When the light-emitting element 5 is a bottom-emission light-emitting element, the light emitted by the light-emitting element 5 is transmitted in a direction from the driving circuit layer 7 to the substrate 6. In this case, the anode 18 of the light-emitting element 5 is a transparent electrode made of a transparent conductive material, while the cathode 20 is a reflective electrode made of an opaque metal material.

Figure 12:
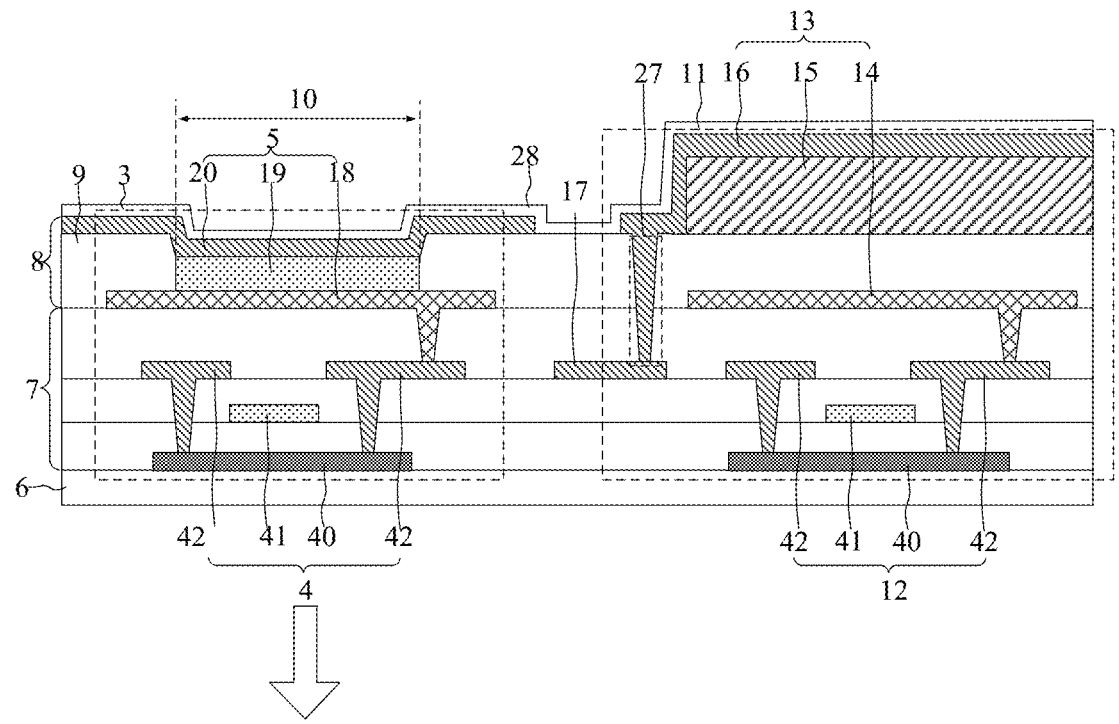
FIG. 12 is a schematic diagram showing the layers shown in FIG. 3 in combination with a light exiting direction according to an embodiment of the present disclosure.

In embodiments of the present disclosure, based on the layer positions of the ultrasonic fingerprint sensor 13 shown in FIG. 3, neither the first electrode 14 nor the second electrode 16 of the ultrasonic fingerprint sensor 13 overlaps with the opening 10 of the light-emitting sub-pixel 3. Therefore, no matter the light-emitting element 5 is a top-emission light-emitting element (referring again to FIG. 3) or a bottom-emission light-emitting element (as shown in FIG. 12, which is a schematic diagram showing the layers shown in FIG. 3 in combination with a light exiting direction), both the first electrode 14 and the second electrode 16 do not affect the normal light emission of the light-emitting element 5, and any one of the first electrode 14 and the second electrode 16 can be either a transparent electrode or a reflective electrode.

Figure 13:
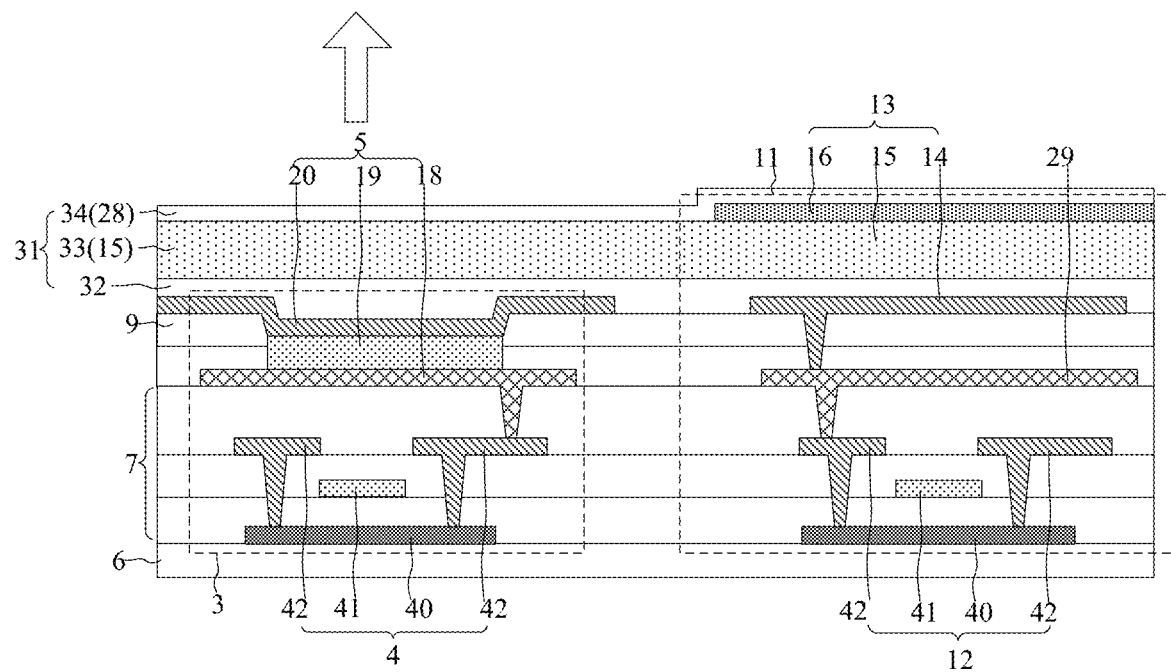
FIG. 13 is a schematic diagram of layers of the fingerprint recognition pixel according to an embodiment of the present disclosure according to an embodiment of the present disclosure.

FIG. 13 is a schematic diagram showing layer of the fingerprint recognition pixel according to an embodiment of the present disclosure. In an implementation, as shown in FIG. 13, the first electrode 14 and the cathode 20 are arranged in the same layer and made of the same material. The projection of the ultrasonic material layer 15 on the substrate 6 covers a projection of the fingerprint recognition area 2 on the substrate 6. In this case, the flatness of the fingerprint recognition area 2 can be improved by using the ultrasonic material layer 15.

Figure 14:
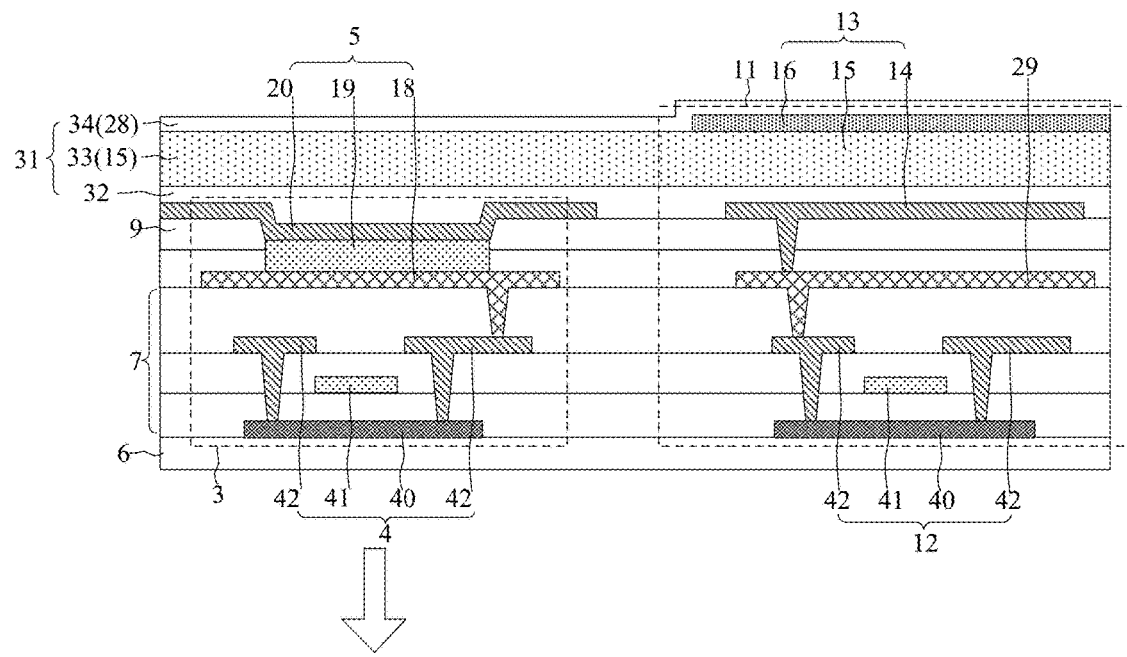
FIG. 14 is a schematic diagram showing the layers shown in FIG. 13 in combination with a light exiting direction according to an embodiment of the present disclosure.

In an embodiment, a projection of the second electrode 16 on the substrate 6 and a projection of the opening 10 on the substrate 6 do not overlap. In this case, no matter the light-emitting element 5 is a top-emission light emitting element shown in FIG. 13 or a bottom-emission light-emitting element shown in FIG. 14, the second electrode 16 does not block the light emitted from the light-emitting element 5, and the second element 16 can be either a transparent electrode or a reflective electrode, and thus the material of the second electrode 16 can be selected in a wide range.

Figure 15:
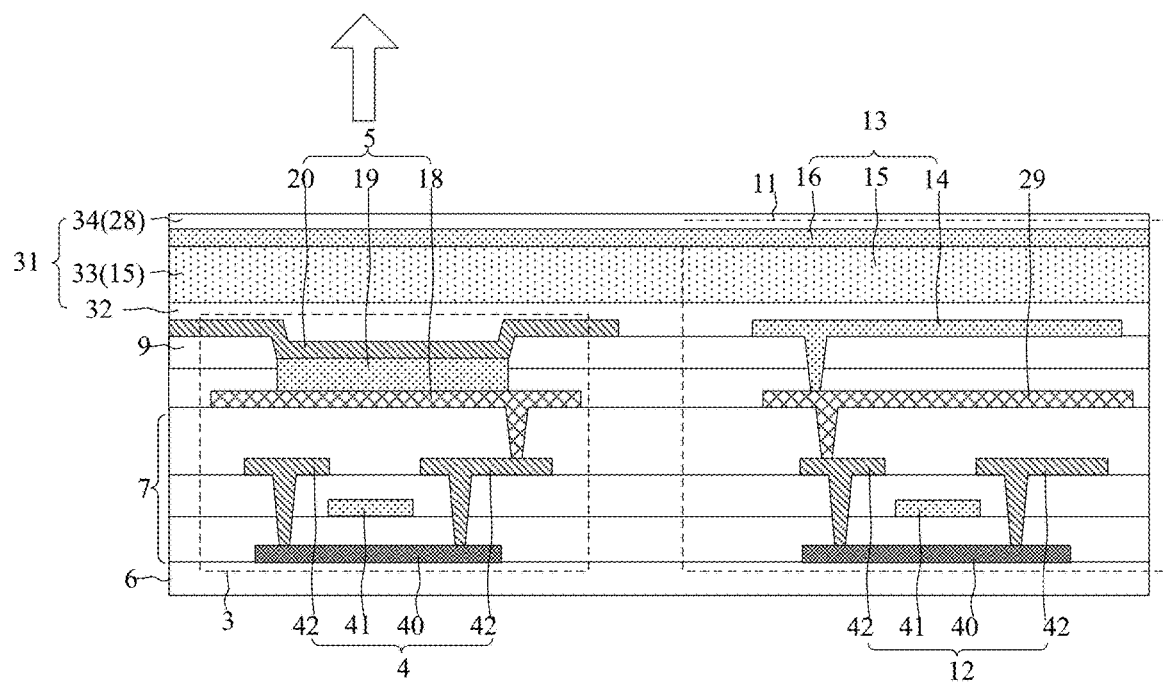
FIG. 15 is a schematic diagram of layers of the fingerprint recognition pixel according to an embodiment of the present disclosure according to an embodiment of the present disclosure.

FIG. 15 is a schematic diagram of layers of the fingerprint recognition pixel 11 according to an embodiment of the present disclosure. In an implementation, as shown in FIG. 15, the projection of the second electrode 16 on the substrate 6 covers the projection of the fingerprint recognition area 2 on the substrate 6. In this structure, a first microcavity is formed between the anode 18 and the cathode 20 of the light-emitting element 5, and a second microcavity can be formed between the cathode 20 and the second electrode 16, thereby increasing the intensity of the emitted light to a greater extent.

Figure 16:
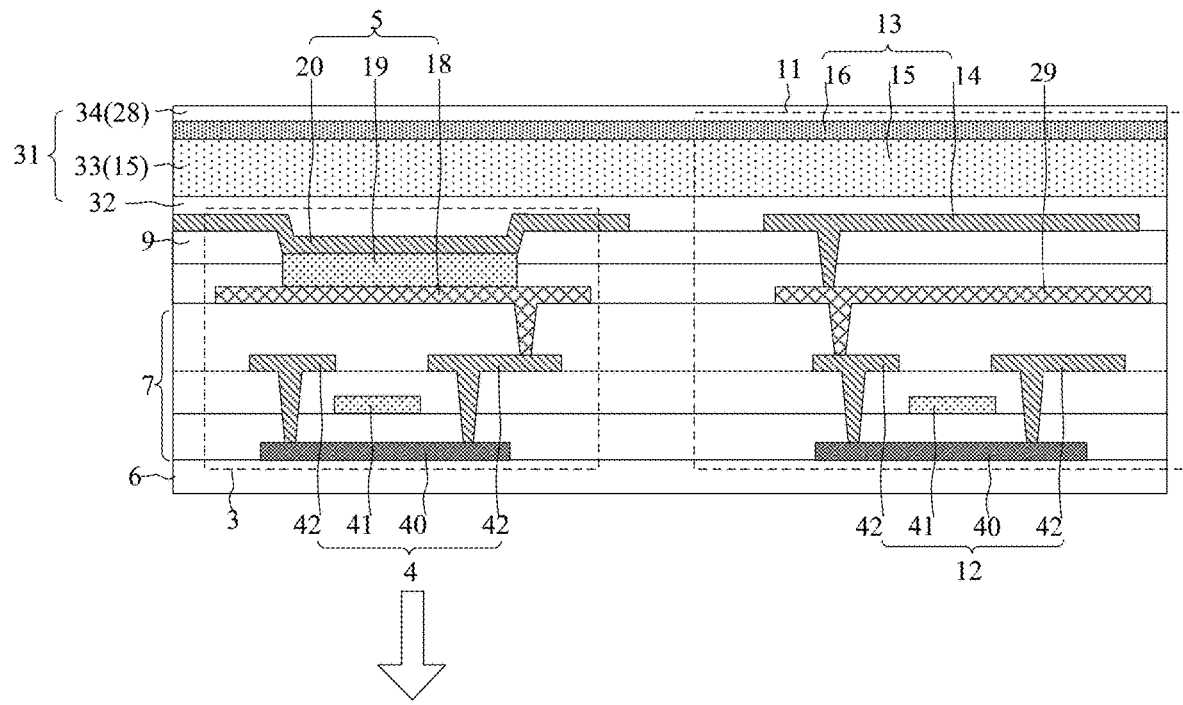
FIG. 16 is a schematic diagram showing the layers shown in FIG. 15 in combination with a light exiting direction according to an embodiment of the present disclosure.

In an embodiment, referring to FIG. 15, when the light-emitting element 5 is a top-emission light-emitting element, in order to reduce the loss of the light emitted by the light-emitting element 5 caused by the second electrode 16, the second electrode 16 can be a transparent electrode. FIG. 16 is a schematic diagram showing the layers shown in FIG. 15 in combination with a light exiting direction. In an embodiment, as shown in FIG. 16, when the light-emitting element 5 is a bottom-emission light-emitting element, the light emitted from the light-emitting element 5 does not pass through the second electrode 16, and thus the second electrode 16 can be either a transparent electrode or a reflective electrode.

In an embodiment, when the first electrode 14 and the cathode 20 are arranged in the same layer, the first electrode 14 is far away from the reading control circuit 12. In order to improve the reliability of the connection between the first electrode 14 and the reading control circuit 12, referring to FIG. 13 to FIG. 16, the first electrode 14 and the reading control circuit 12 can be electrically connected by an auxiliary connection layer 29, and the auxiliary connection layer 29 and the anode 18 can be arranged in the same layer.

Figure 17:
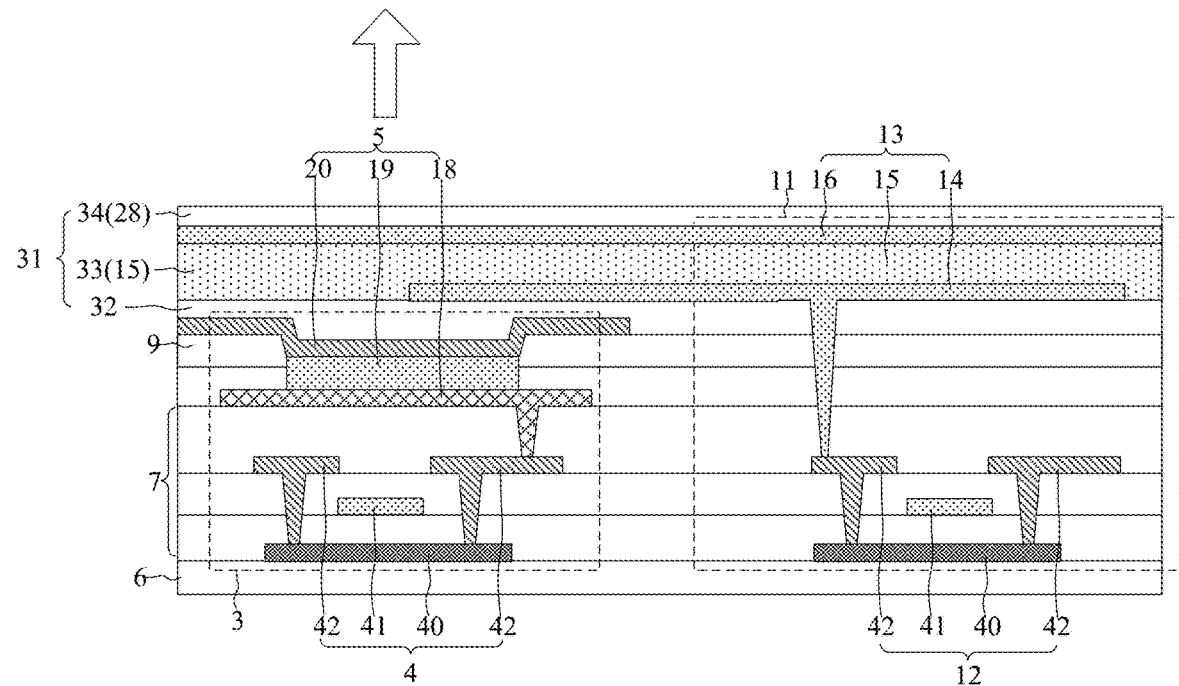
FIG. 17 is a schematic diagram of layers of the fingerprint recognition pixel according to an embodiment of the present disclosure according to an embodiment of the present disclosure.
Figure 18:
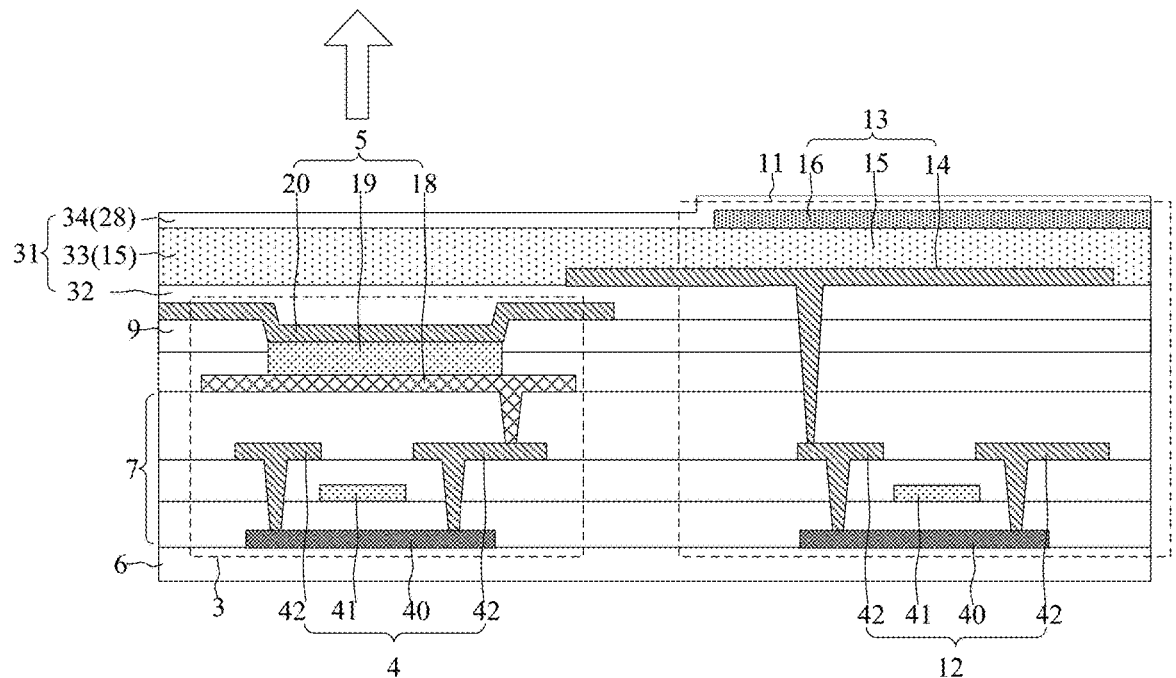
FIG. 18 is a schematic diagram of layers of the fingerprint recognition pixel according to an embodiment of the present disclosure according to an embodiment of the present disclosure.

FIG. 17 is a schematic diagram of layers of the fingerprint recognition pixel 11 according to an embodiment of the present disclosure, and FIG. 18 is a schematic diagram of layers of the fingerprint recognition pixel 11 according to an embodiment of the present disclosure. In an embodiment, as shown in FIG. 17 and FIG. 18, the light-emitting element layer 8 includes an anode 18 located on a side of the pixel definition layer 9 facing towards the substrate 6, a light-emitting layer 19 located in the opening 10, and a cathode 20. At least a part of the anode 18 is exposed in the opening 10, a first part of the cathode 20 is located on a side of the pixel definition layer 9 facing away from the substrate 6, and a second part of the cathode 20 is located on a side of the light-emitting layer 19 facing away from the substrate 6. The first electrode 14 is located on a side of the cathode 20 facing away from the substrate 6.

In this case, the layer where the ultrasonic fingerprint sensor 13 is located and a layer where the light-emitting element 5 is located are different layers, the positions of the first electrode 14 and the second electrode 16 can be set without taking the positions of the anode 18 and the cathode 20 into account, and thus the areas of the first electrode 14 and/or the second electrode 16 can be increased to a greater extent, thereby increasing the recognition accuracy of the ultrasonic fingerprint sensor 13.

As shown in FIG. 17, the first electrode 14 and the second electrode 16 overlap with the opening 10, when the light-emitting element 5 is a top-emission element, both the first electrode 14 and the second electrode 16 are transparent electrodes, preventing the first electrode 14 and the second electrode 16 from blocking the light emitted by the light-emitting element 5. As shown in FIG. 18, the first electrode 14 and the second electrode 16 do not overlap with the opening 10, when the light-emitting element 5 is a top-emission light-emitting element, the first electrode 14 and the second electrode 16 do not block the light emitted by the light-emitting element 5, and any one of the first electrode 14 and the second electrode 16 can be either the transparent electrode or the reflective electrode.

Figure 19:
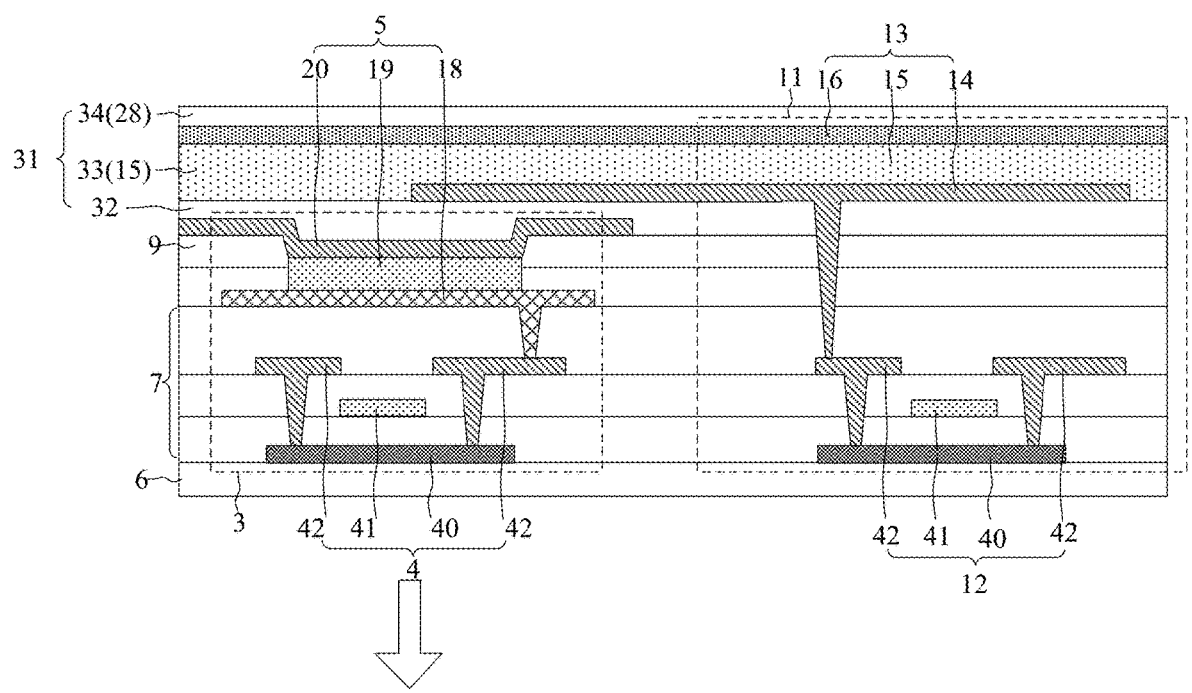
FIG. 19 is another schematic diagram showing the layers shown in FIG. 17 in combination with a light exiting direction according to an embodiment of the present disclosure.
Figure 20:
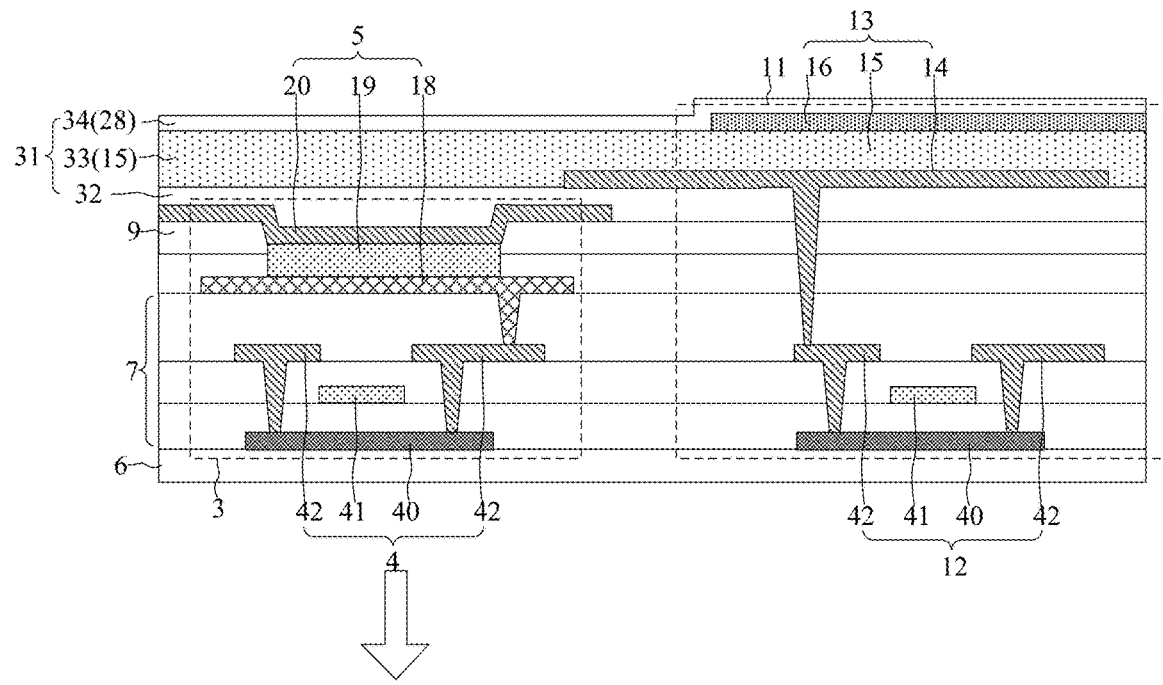
FIG. 20 is another schematic diagram showing the layers shown in FIG. 18 in combination with a light exiting direction according to an embodiment of the present disclosure.

FIG. 19 is another schematic diagram showing the layers shown in FIG. 17 in combination with a light exiting direction. FIG. 20 is a schematic diagram showing the layers shown in FIG. 18 in combination with a light exiting direction. As shown in FIG. 19 and FIG. 20, when the light-emitting element 5 is a bottom-emission element, no matter whether the first electrode 14 and the second electrode 16 overlap with the opening 10 or not, the first electrode 14 and the second electrode 16 will not affect the light emitted by the light-emitting element 5, and any one of the first electrode 14 and the second electrode 16 can be either the transparent electrode or the reflective electrode.

In an embodiment, when the light-emitting element 5 is a top-emission light-emitting element, please refer to FIG. 3, FIG. 13 and FIG. 18 again, neither an orthogonal projection of the first electrode 14 on the substrate 6 nor an orthogonal projection of the second electrode 16 on the substrate 6 overlaps with the projection of the opening 10 on the substrate 6. In this case, the first electrode 14 and the second electrode 16 do not overlap with the opening 10, and the first electrode 14 and the second electrode 16 can be made of either the transparent conductive material or the opaque metal material, and thus the material of the first electrode 14 and the second electrode 16 can be elected in a wide range.

In an embodiment, when the light-emitting element 5 is the top-emission light-emitting element, please refer to FIG. 17 again, in the direction perpendicular to the plane of the substrate 6, the first electrode 14 is located on the side of the cathode 20 facing away from the substrate 6, both the orthogonal projection of the first electrode 14 on the substrate 6 and the orthogonal projection of the second electrode 16 on the substrate 6 overlap with the projection of the opening 10 on the substrate 6, and both the first electrode 14 and the second electrode 16 are transparent electrodes. In this case, both the first electrode 14 and the second electrode 16 are transparent electrodes, and thus do not affect the light transmission. Moreover, the positions of the first electrode 14 and the second electrode 16 are not restricted by the positions of the anode 18 and the cathode 20, and thus the areas of the first electrode 14 and the second electrode 16 can be increased to a greater extent, thereby increasing the area and recognition accuracy of the ultrasonic fingerprint sensor 13.

In an embodiment, when the light-emitting element 5 is the bottom-emission light-emitting element, referring again to FIG. 19, the first electrode 14 is located on the side of the cathode 20 facing away from the substrate 6, and both the orthogonal projection of the first electrode 14 on the substrate 6 and the orthogonal projection of the second electrode 16 on the substrate 6 overlap with the projection of the opening 10 on the substrate 6. In this case, each of the first electrode 14 and the second electrode 16 can be either the transparent electrode or the reflective electrode. Moreover, the positions of the first electrode 14 and the second electrode 16 are not restricted by the positions of the anode 18 and the cathode 20, and thus the areas of the first electrode 14 and the second electrode 16 can be increased to a greater extent, thereby increasing the area and recognition accuracy of the ultrasonic fingerprint sensor 13.

In an embodiment, referring to FIG. 13 and to FIG. 20, the display panel further includes an encapsulation layer 31 for isolating water and oxygen. The encapsulation layer 31 is located on the side of the cathode 20 facing away from the substrate 6. The encapsulation layer 31 includes a first inorganic encapsulation layer 32, an organic encapsulation layer 33, and a second inorganic encapsulation layer 34, which are sequentially arranged in a direction from the substrate 6 to the driving circuit layer 7. The ultrasonic material layer 15 is reused as the organic encapsulation layer 33. That is, the ultrasonic material layer 15 further serves as the organic encapsulation layer 33 to prevent cracks from spreading, so that there is no need to additionally form the organic encapsulation layer 33.

Moreover, when the projection of the ultrasonic material layer 15 on the substrate 6 covers the projection of the fingerprint recognition area 2 on the substrate 6, the ultrasonic material layer 15 covers the entire plane and can prevent, at all positions, cracks from spreading, thereby improving the encapsulation reliability.

In an embodiment, referring to FIG. 13 and to FIG. 20, the display panel further includes a protection layer 28 located on the second electrode 16 facing away from the substrate 6. In order to simplify the process flow, the protection layer 28 is reused the second inorganic encapsulation layer 34.

Figure 21:
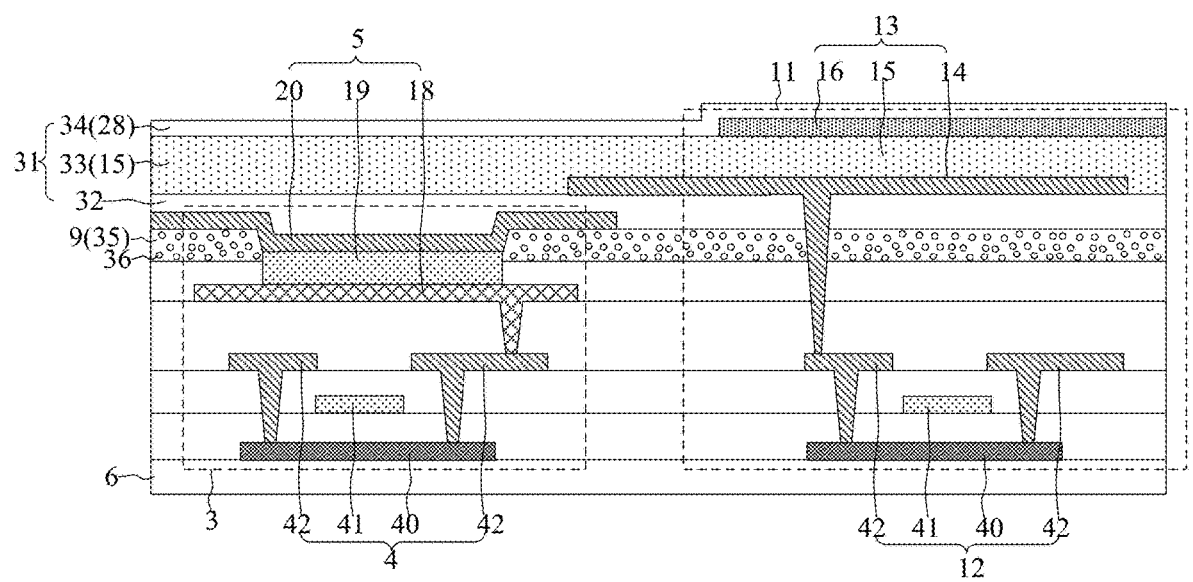
FIG. 21 is a schematic diagram of an ultrasonic absorbing layer according to an embodiment of the present disclosure.

FIG. 21 is a schematic diagram showing a structure of an ultrasonic absorbing layer according to an embodiment of the present disclosure. In an embodiment, as shown in FIG. 21, the display panel further includes an ultrasonic absorbing layer 35, and the ultrasonic absorbing layer 35 is located on the side of the first electrode 14 facing towards the substrate 6.

When the ultrasonic material layer 15 converts the electrical signal into the ultrasonic signal, a part of the ultrasonic signal can continue to be transmitted toward the side first electrode 14 facing towards the substrate 6. If this part of ultrasonic signal is reflected back by a metal film below the first electrode 14, it will cause signal interference, increase the signal-to-noise ratio of the fingerprint signal, and affect the recognition accuracy. In embodiments of the present disclosure, the ultrasonic absorbing layer 35 is arranged on the side of the first electrode 14 facing towards the substrate 6, and this part of ultrasonic signal can be absorbed by the ultrasonic absorbing layer 35, thereby avoiding the interference on the fingerprint recognition caused by this part of the ultrasonic signal.

In an embodiment, referring again to FIG. 21, when the first electrode 14 is located on the side of the pixel definition layer 9 facing away from the substrate 6, the pixel definition layer 9 can be reused as the ultrasonic material layer 15.

In an embodiment, the ultrasonic absorbing layer 35 is provided with a plurality of ultrasonic absorbing holes 36. On one hand, the ultrasonic absorbing holes 36 can absorb the ultrasonic signal. On the other hand, the layer with multiple holes has a better support ability, and the support performance of the layer is optimized.

Figure 22:
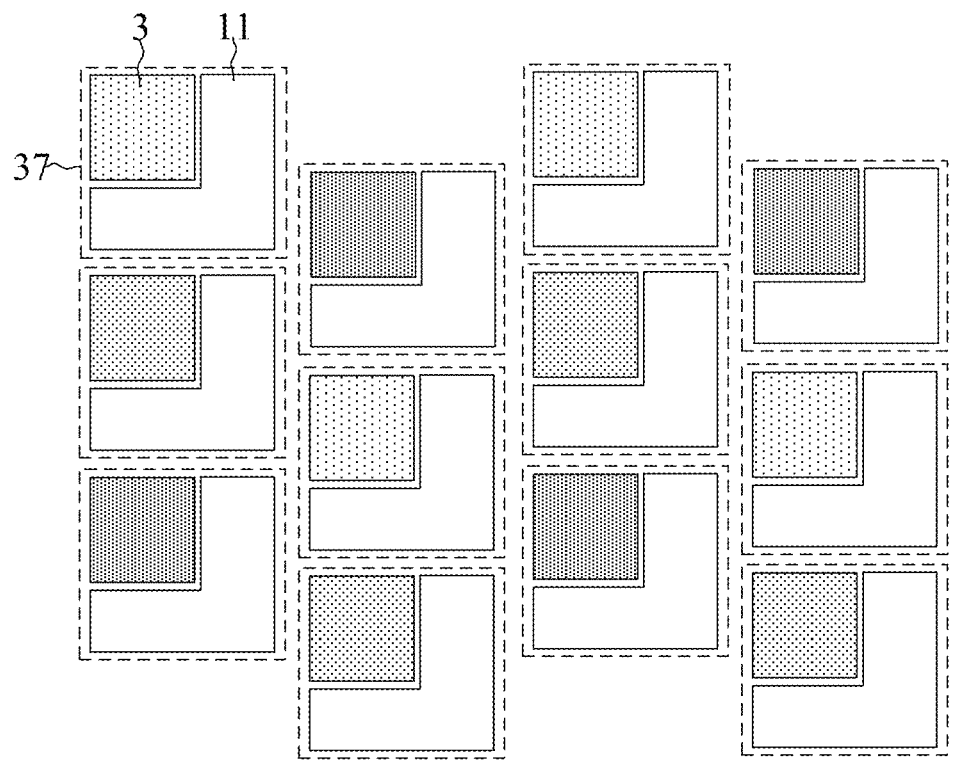
FIG. 22 is a schematic diagram of a display recognition unit according to an embodiment of the present disclosure.
Figure 23:
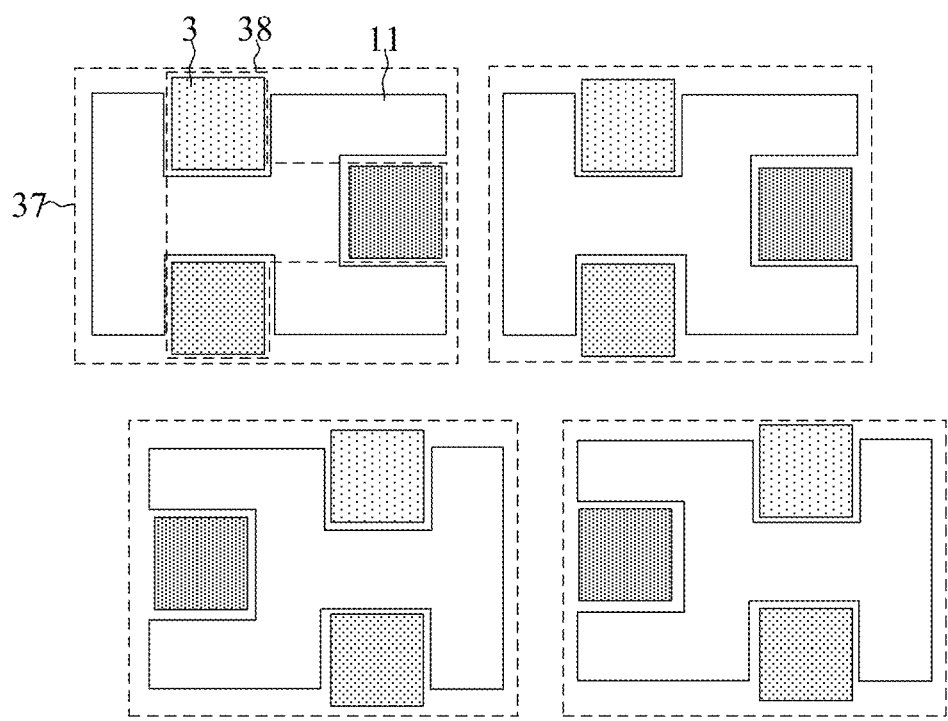
FIG. 23 is a schematic diagram of a display recognition unit according to an embodiment of the present disclosure.

FIG. 22 is a schematic diagram of a display recognition unit according to an embodiment of the present disclosure. FIG. 23 is a schematic diagram of a display recognition unit according to an embodiment of the present disclosure. In an embodiment, as shown in FIG. 22 and FIG. 23, a plurality of display recognition units 37 is provided in the fingerprint recognition area 2, and each of the plurality of display recognition units 37 includes at least one light-emitting sub-pixel 3 and one fingerprint recognition pixel 11, such that the fingerprint recognition pixels 11 are uniformly distributed in the fingerprint recognition area 2, thereby improving the fingerprint recognition accuracy.

In an embodiment, referring to FIG. 22, each display recognition unit 37 includes one light-emitting sub-pixel 3 and one fingerprint recognition pixel 11. In this case, there are a larger number of fingerprint recognition pixels 11 located in the fingerprint recognition area 2, which improves the recognition accuracy.

In an embodiment, referring to FIG. 23, at least two light-emitting sub-pixels 3 form one display pixel 38, and each display recognition unit 37 includes one display pixel 38 and one fingerprint recognition pixel 11. In this case, each fingerprint recognition pixel 11 has a large area, and accordingly, the available space in the fingerprint recognition pixel 11 for arranging the reading control circuit 12 is larger, which better meets the structure design where the reading control circuit 12 includes multiple transistors.

When each display recognition unit 37 includes at least one light-emitting sub-pixel 3 and one fingerprint recognition pixel 11, if the first electrode 14 and the second electrode 16 of the ultrasonic fingerprint sensor 13 in the fingerprint recognition pixel 11 are each arranged in different layers from the cathode 20, the projection of the first electrode 14 on the substrate 6 or the projection of the second electrode 16 on the substrate 6 can overlap with the projection of the cathode 20 of the light-emitting element 5 on the substrate 6, thereby increasing the area of the ultrasonic fingerprint sensor 13 and increasing the recognition accuracy. If the first electrode 14 or the second electrode 16 is arranged in the same layer as the cathode 20, the first electrode 14 or the second electrode 16 can be arranged in the same manner as FIG. 5 to FIG. 8.

Figure 24:
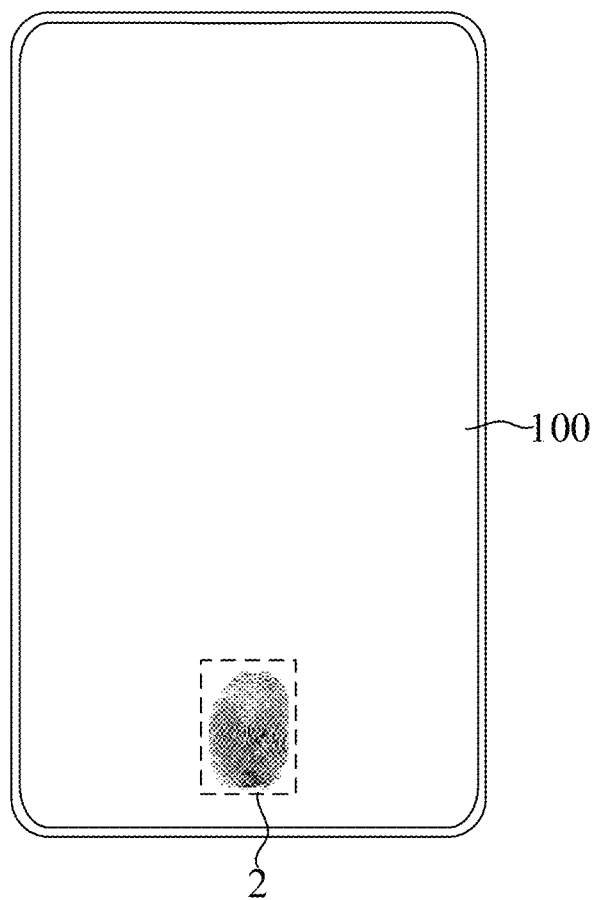
FIG. 24 is a schematic diagram of a display device according to an embodiment of the present disclosure.

Based on the same inventive concept, embodiments of the present disclosure further provide a display device. FIG. 24 is a schematic diagram of a display device according to an embodiment of the present disclosure. As shown in FIG. 24, the display device includes the above display panel. The specific structure of the display panel 100 is described in detail in the above embodiments, and will not be repeated herein. The display device shown in FIG. 24 is only illustrative, and the display device can be any electronic device having a display function, such as a mobile phone, a tablet computer, a notebook computer, an electronic paper book, or a television.

The above are merely some embodiments of the present disclosure, and are not intended to limit the present disclosure. Any modifications, equivalent substitutions or improvements made within the principles of the present disclosure shall be included in the protection scope of the present disclosure.

It should be noted that the above embodiments are only used to illustrate, but not to limit the technical solutions of the present disclosure. Although the present application is described in detail with reference to the foregoing embodiments, those skilled in the art shall understand that they can modify the technical solutions described in the foregoing embodiments, or equivalently replace some or all of the technical features. The modifications or replacements shall not direct the essence of the corresponding technical solutions away from the scope of the technical solutions of the embodiments of the present disclosure.

What is claimed is:

1. A display panel, comprising:
    a substrate;
    a driving circuit layer located on the substrate; and
    a light-emitting element layer located on a side of the driving circuit layer facing away from the substrate,
    wherein the display panel comprises a plurality of light-emitting sub-pixels arranged in a display area of the display panel, and a plurality of fingerprint recognition pixels arranged in a fingerprint recognition area, wherein at least a part of the display area is reused as the fingerprint recognition area;
    wherein each light-emitting sub-pixel of the plurality of light-emitting sub-pixels comprises a light-emitting element and a pixel driving circuit electrically connected to the light-emitting element, wherein the pixel driving circuit is arranged in the driving circuit layer, wherein the light-emitting element is arranged in the light-emitting element layer, wherein the light-emitting element layer comprises a pixel definition layer, and wherein the pixel definition layer has openings, wherein each of the openings defines a light exiting area of one light-emitting sub-pixel of the plurality of light-emitting sub-pixels; and
    wherein each fingerprint recognition pixel of the plurality of fingerprint recognition pixels comprises an ultrasonic fingerprint sensor and a reading control circuit, wherein the reading control circuit is arranged in the driving circuit layer, wherein the ultrasonic fingerprint sensor comprises a first electrode, an ultrasonic material layer, and a second electrode that are arranged sequentially along a direction from the substrate to the driving circuit layer, wherein the first electrode is electrically connected to the reading control circuit, and wherein the ultrasonic material layer is located on a side of the pixel definition layer facing away from the substrate.

2. The display panel according to claim 1, wherein the light-emitting element layer further comprises:
    an anode disposed on a side of the pixel definition layer facing towards the substrate, wherein at least a part of the anode is exposed in one of the openings;
    a light-emitting layer disposed in the one of the openings; and
    a cathode including a first part located on the side of the pixel definition layer facing away from the substrate and a second part disposed on a side of the light-emitting layer facing away from the substrate,
    wherein the first electrode or the second electrode is disposed in a same layer as the cathode and made of a same material as the cathode.

3. The display panel according to claim 2, wherein the fingerprint recognition area comprises a plurality of sub-areas that having a same size, and adjacent sub-areas of the plurality of sub-areas are spaced apart by a first spacing;
    wherein at least one of the plurality of light-emitting sub-pixels and one of the ultrasonic fingerprint sensors of the plurality of fingerprint recognition pixels are arranged in each sub-area of the plurality of sub-areas, wherein the cathode of one of the plurality of light-emitting sub-pixels is spaced apart from the first electrode or the second electrode of one of the ultrasonic fingerprint sensors by a second spacing; and
    wherein the cathodes of the plurality of light-emitting sub-pixels are electrically connected by a connection electrode extending in the first spacing.

4. The display panel according to claim 3, wherein at least four light-emitting sub-pixels of the plurality of light-emitting sub-pixels form a plurality of sub-pixel groups arranged in a first direction, wherein each sub-pixel group of the plurality of sub-pixel groups comprises at least two of the plurality of light-emitting sub-pixels that are arranged in a second direction, wherein light-emitting sub-pixels of the plurality of light-emitting sub-pixels in two adjacent sub-pixel groups of the plurality of sub-pixel groups are arranged in a staggered manner in the first direction, and the first direction intersects with the second direction;
    wherein the fingerprint recognition area comprises a plurality of sub-area groups arranged in the first direction, wherein each sub-area group of the plurality of sub-area groups comprises at least two of the plurality of sub-areas that are arranged in the second direction, and wherein sub-areas of the plurality of sub-areas in two adjacent sub-area groups of the plurality of sub-area groups are arranged in a staggered manner in the first direction; and
    wherein one of the plurality of light-emitting sub-pixels and one of the ultrasonic fingerprint sensors are arranged in each of the plurality of sub-areas, wherein the cathode of each light-emitting sub-pixel of the plurality of light-emitting sub-pixels is arranged at a vertex angle of one of the plurality of sub-areas and has a length of A in each one of the first direction and the second direction, and wherein each sub-area of the plurality of sub-areas has a length of 2A in each one of the first direction and the second direction.

5. The display panel according to claim 3, wherein at least four light-emitting sub-pixels of the plurality of light-emitting sub-pixels form a plurality of sub-pixel groups arranged in a first direction, wherein each sub-pixel group of the plurality of sub-pixel groups comprises at least two of the plurality of light-emitting sub-pixels that are arranged in a second direction, wherein light-emitting sub-pixels of the plurality of light-emitting sub-pixels in two adjacent sub-pixel groups of the plurality of sub-pixel groups are arranged in a staggered manner in the first direction, and the first direction intersects with the second direction;

wherein the fingerprint recognition area comprises a plurality of sub-area groups arranged in the second direction, wherein each sub-area group of the plurality of sub-area groups comprises at least two of the plurality of sub-areas that are arranged in the first direction, and wherein sub-areas of the plurality of sub-areas in two adjacent sub-area groups of the plurality of sub-area groups are arranged in a staggered manner in the second direction; and wherein three of the plurality of light-emitting sub-pixels that have different colors from each other, wherein one of the ultrasonic fingerprint sensors is arranged in each sub-area of the plurality of sub-areas, wherein the cathode of each light-emitting sub-pixel of the plurality of light-emitting sub-pixels is arranged at a vertex angle of one of the plurality of sub-areas and has a length of A in each one of the first direction and the second direction, and wherein each sub-area of the plurality of sub-areas has a length of 4A in the first direction and a length of 3A in the second direction.

6. The display panel according to claim 2, wherein the second electrode and the cathode are arranged in a same layer, and wherein a projection of the ultrasonic material layer on the substrate and a projection of the cathode on the substrate do not overlap with each other.

7. The display panel according to claim 6, further comprising:

spacers each arranged in a same layer as the ultrasonic material layer and made of a same material as the ultrasonic material layer.

8. The display panel according to claim 6, wherein the second electrode is electrically connected to a detection signal line through a first via hole of the pixel definition layer, and wherein a projection of the first via hole on the substrate is located between a projection of the light-emitting layer on the substrate and the projection of the ultrasonic material layer on the substrate.

9. The display panel according to claim 2, wherein the first electrode and the cathode are arranged in a same layer, and wherein a projection of the ultrasonic material layer on the substrate covers a projection of the fingerprint recognition area on the substrate.

10. The display panel according to claim 9, wherein a projection of the second electrode on the substrate and does not overlap with projections of the openings on the substrate.

11. The display panel according to claim 9, wherein the first electrode and the reading control circuit are electrically connected to each other through an auxiliary connection layer, and the auxiliary connection layer and the anode are arranged in a same layer.

12. The display panel according to claim 1, wherein the light-emitting element is a top-emission light-emitting element, and neither an orthogonal projection of the first electrode on the substrate nor an orthogonal projection of the second electrode on the substrate overlaps with projections of the openings on the substrate.

13. The display panel according to claim 1, wherein the light-emitting element is a top-emission light-emitting element, wherein in a direction perpendicular to a plane of the substrate, the first electrode is disposed on a side of the cathode facing away from the substrate, and wherein both an orthogonal projection of the first electrode on the substrate and an orthogonal projection of the second electrode on the substrate overlap with a projection of one of the openings on the substrate, and wherein each one of the first electrode and the second electrode is a transparent electrode.

14. The display panel according to claim 1, wherein the light-emitting element is a bottom-emission light-emitting element;

wherein the first electrode is disposed on a side of the cathode facing away from the substrate, and wherein both an orthogonal projection of the first electrode on the substrate and an orthogonal projection of the second electrode on the substrate overlap with a projection of one of the openings on the substrate.

15. The display panel according to claim 1, further comprising:

an encapsulation layer disposed on a side of the cathode facing away from the substrate, wherein the encapsulation layer comprises a first inorganic encapsulation layer, an organic encapsulation layer, and a second inorganic encapsulation layer that are sequentially arranged in a direction from the substrate to the driving circuit layer, and the ultrasonic material layer is reused as the organic encapsulation layer.

16. The display panel according to claim 1, further comprising:

an ultrasonic absorbing layer located on a side of the first electrode facing towards the substrate, wherein the ultrasonic absorbing layer is provided with a plurality of ultrasonic absorbing holes.

17. The display panel according to claim 1, wherein the display panel comprises a plurality of display recognition units arranged in the fingerprint recognition area, and wherein each display recognition unit of the plurality of display recognition units comprises at least one of the plurality of light-emitting sub-pixels and one of the plurality of fingerprint recognition pixels.

18. The display panel according to claim 17, wherein the at least one of the plurality of light-emitting sub-pixels comprises one of the plurality of light-emitting sub-pixels.

19. The display panel according to claim 17, wherein at least two of the plurality of light-emitting sub-pixels form one of a plurality of display pixels, and wherein each display recognition unit of the plurality of display recognition units comprises one of the plurality of display pixels and one of the plurality of fingerprint recognition pixels.

20. A display device, comprising a display panel, wherein the display panel comprises a substrate, a driving circuit layer disposed on the substrate, and a light-emitting element layer disposed on a side of the driving circuit layer facing away from the substrate;

wherein the display panel comprises a plurality of light-emitting sub-pixels arranged in a display area of the display panel, and a plurality of fingerprint recognition pixels arranged in a fingerprint recognition area, wherein at least a part of the display area is reused as the fingerprint recognition area;

wherein each light-emitting sub-pixel of the plurality of light-emitting sub-pixels comprises a light-emitting element and a pixel driving circuit electrically connected to the light-emitting element, wherein the pixel driving circuit is arranged in the driving circuit layer, wherein the light-emitting element is arranged in the light-emitting element layer, wherein the light-emitting element layer comprises a pixel definition layer, and wherein the pixel definition layer has openings, wherein each the openings defines a light exiting area of one of the plurality of light-emitting sub-pixels; and wherein each fingerprint recognition pixel of the plurality of fingerprint recognition pixels comprises an ultrasonic fingerprint sensor and a reading control circuit, wherein the reading control circuit is arranged in the driving circuit layer, wherein the ultrasonic fingerprint sensor comprises a first electrode, an ultrasonic material layer, and a second electrode that are arranged sequentially along a direction from the substrate to the driving circuit layer, wherein the first electrode is electrically connected to the reading control circuit, and the ultrasonic material layer is located on a side of the pixel definition layer facing away from the substrate.

* * * * *